(12) United States Patent
Nishimura et al.

(10) Patent No.: US 8,230,590 B2
(45) Date of Patent: Jul. 31, 2012

(54) METHOD FOR MOUNTING ELECTRONIC COMPONENTS

(75) Inventors: Takao Nishimura, Kawasaki (JP); Yoshiaki Narisawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1028 days.

(21) Appl. No.: 11/968,971

(22) Filed: Jan. 3, 2008

(65) Prior Publication Data

US 2008/0196245 A1    Aug. 21, 2008

(30) Foreign Application Priority Data

Feb. 15, 2007 (JP) ................................ 2007-035280

(51) Int. Cl.
*H05K 3/30* (2006.01)
*H05K 13/04* (2006.01)
*H01L 24/02* (2006.01)

(52) U.S. Cl. ............... 29/841; 29/832; 29/856; 29/854; 29/743

(58) Field of Classification Search ................. 29/832, 29/841, 854–856; 438/106–127
See application file for complete search history.

(56) References Cited

U.S. PATENT DOCUMENTS

| | | | | |
|---|---|---|---|---|
| 4,593,462 A | * | 6/1986 | Yagi et al. | 29/740 |
| 4,951,388 A | * | 8/1990 | Eguchi et al. | 29/832 |
| 5,784,777 A | * | 7/1998 | Asai et al. | 29/832 |
| 6,006,426 A | * | 12/1999 | Kira et al. | 29/836 |
| 6,223,429 B1 | * | 5/2001 | Kaneda et al. | 29/832 |
| 6,519,840 B1 | * | 2/2003 | Stalder | 29/833 |
| 7,687,319 B2 | * | 3/2010 | Nishimura et al. | 438/118 |
| 2001/0040793 A1 | * | 11/2001 | Inaba | 361/749 |
| 2004/0212082 A1 | * | 10/2004 | Yang | 257/723 |
| 2005/0172891 A1 | * | 8/2005 | Suzuki et al. | 118/300 |

FOREIGN PATENT DOCUMENTS

JP        11-176849 A        7/1999

* cited by examiner

*Primary Examiner* — Derris Banks
*Assistant Examiner* — Kaying Kue
(74) *Attorney, Agent, or Firm* — Westerman, Hattori, Daniels & Adrian, LLP

(57) ABSTRACT

A method for mounting electronic components includes a step of providing an adhesive on each of plural electronic component mounting parts on a wiring board; and a step of fixing one of the electronic components on each of the plural electronic component mounting parts via the adhesive. When the adhesive is provided on each of the plural electronic component mounting parts, the center of gravity of a volume of the adhesive provided on the mounting part where an Nth electronic component is to be mounted is shifted in a direction closer to the mounting part where an (N minus 1 or greater)th electronic component is provided neighboring and adjacent to the mounting part where the Nth electronic component is to be mounted.

12 Claims, 20 Drawing Sheets

FIG.10
(a) 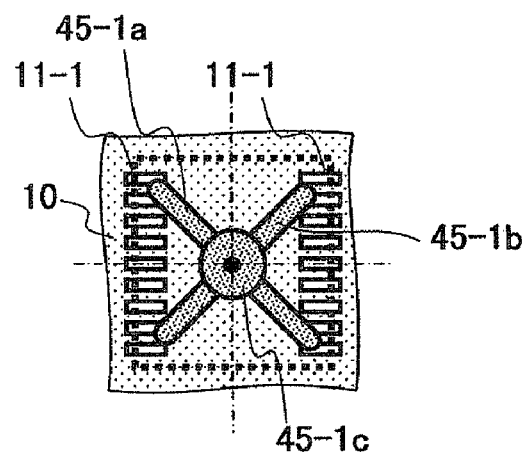
(b) 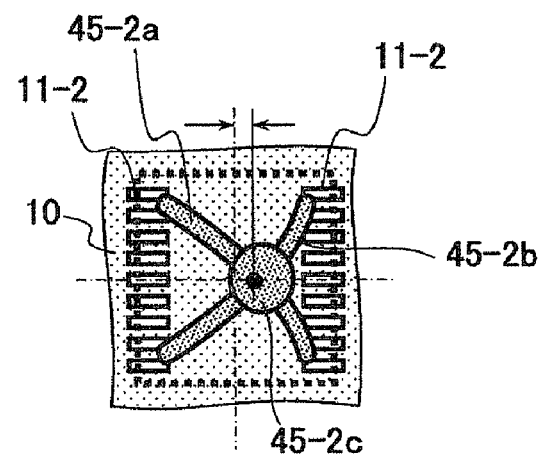
(c) 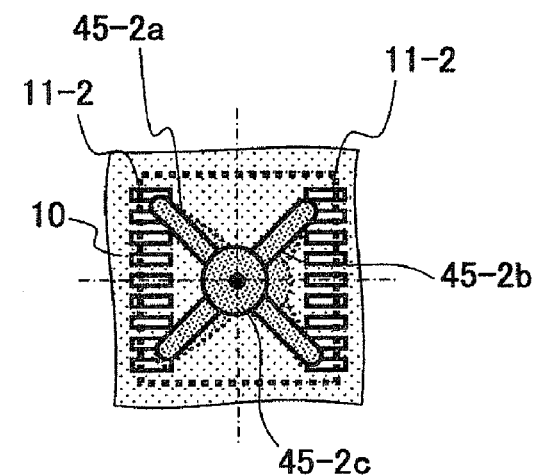

METHOD FOR MOUNTING ELECTRONIC COMPONENTS

BACKGROUND OF THE INVENTION

1. Field of the Invention

The present invention generally relates to methods for mounting electronic components. More specifically, the present invention relates to a method for mounting plural electronic components on a supporting board via adhesives.

2. Description of the Related Art

As one method for mounting electronic components such as semiconductor elements on a supporting board such as a wiring board, there is a method for providing, in advance, a paste adhesive to mounting parts for the electronic components of the supporting board and then pressing the electronic components suctioned and held by a suction tool to the mounting parts where the adhesives are provided so as to fix the electronic components on the supporting board.

Such a method is applied when plural semiconductor elements are mounted on a large size supporting board by using a so-called flip-chip bonding (face-down bonding) method or a so-called die bonding method.

In this method, there is a step for providing the adhesives on electronic component mounting expected parts of the wiring board and a step for mounting the electronic components on the electronic component mounting expected parts separately from each other. In addition, since processes for providing the adhesives are continuously implemented in the step for providing and processes for mounting the electronic components are continuously implemented in the step for mounting, it is possible to improve productivities.

In this method, providing and forming of the adhesives on the electronic component mounting expected parts of the wiring board are implemented by a dispensing method, a printing method or a transferring method.

In the dispensing method, it is possible to easily form minute adhesive patterns. The adhesives can be provided and formed with high precision and various kinds of patterns by using a robot dispenser.

In addition, a circular-shaped pattern situated in a center part of the electronic component mounting expected part, a substantially rectangular-shaped pattern having a configuration similar to a fixed area of the electronic component, a multipoint pattern, a radial pattern where plural lines cross each other in a center part, or the like is applied as a pattern configuration of the adhesive formed on the supporting board. See, for example, Japanese Laid-Open Patent Application Publication No. 11-176849.

A pattern for providing and forming the adhesive is properly selected based on the size of the electronic component to be mounted on the supporting board, material physical properties of the adhesive, the material of the surface of the supporting board, operating condition at the time of mounting such as the load, temperature, and others.

A fixing surface of the electronic component such as a semiconductor element normally has a substantially rectangular-shaped configuration. Accordingly, volume distribution of the adhesive can be made equally by forming the configuration of the providing or forming pattern of the adhesive on the electronic component mounting expected part of the supporting board with a point symmetrical shape. As a result of this, when the electronic component is pressed onto the adhesive by using a suction tool so as to be fixed on the supporting board, the adhesive can be equally spread in a substantially point symmetrical shape from the center part of the electronic component mounting expected part of the supporting board. As a result of this, the fixing surface of the electronic component comes in even contact with the adhesive so as to be fixed on the supporting board.

FIG. 1 is a first cross-sectional view showing a related art method for mounting semiconductor elements on a wiring board. In an example shown in FIG. 1, a semiconductor device is mounted on the supporting board by using a so-called flip-chip bonding (face-down bonding) method.

Paste adhesives 2 are provided on plural semiconductor element mounting expected parts S provided on an upper surface of a supporting board 1. Electrode terminals 3 are provided at each semiconductor element mounting expected part S. The electrode terminals 3 correspond to outside connection terminals of the semiconductor elements to be mounted.

On the other hand, a main surface of a semiconductor element 4 where outside connection terminals 5 are provided is made to face the supporting board 1 and the semiconductor element 4 is suctioned and held by the suction tool 6. In addition, the outside connection terminals 5 of the semiconductor element 4 and the electrode terminals 3 of the supporting board 1 are made to face each other so that positioning is made. See FIG. 1(a).

At this time, inside the suctioning part 7 of the suction tool 6 is a negative pressure. The negative pressure is maintained until suctioning of the semiconductor element 4 by the suction tool 5 is turned off.

Next, the suction tool 6 is lowered so that the semiconductor element 4 is fixed on the supporting board 1 via the adhesive 2 and the outside connection terminals 5 of the semiconductor element 4 and the electrode terminals 3 of the supporting board 1 are connected to each other. See FIG. 1(b).

After that, the suctioning of the semiconductor element 4 by the suction tool 6 is turned off and the suction tool 6 is raised. See FIG. 1(c).

At this time, in order to securely turn off the suctioning of the semiconductor element 4 by the suction tool 6, the inside of the suctioning part 7 of the suction tool 6 that has the negative pressure is switched to a positive pressure so that compressed air W is jetted from the suctioning part 7 to the circumference. See the arrows in FIG. 1(c).

Thus, according to the related art method shown in FIG. 1, when the semiconductor elements 4 are continuously mounted and fixed on plural semiconductor element mounting expected parts S of the supporting board 1, after the semiconductor element 4 suctioned and held by the suction tool 6 is fixed on the semiconductor element mounting expected part S, suctioning by the suction tool 6 is stopped and the suction tool 6 is raised while the compressed air is jetted from the suction tool 6 to the circumference.

FIG. 2 is a second cross-sectional view showing the related art method for mounting the semiconductor elements on the wiring board. In FIG. 2, parts that are the same as the parts shown in FIG. 1 are given the same reference numerals, and explanation thereof is omitted.

The paste adhesives 2 are provided on the plural semiconductor element mounting expected parts S provided on the upper surface of the supporting board 1. The electrode terminals 3 are provided at each semiconductor element mounting expected part S. The electrode terminals 3 correspond to outside connection terminals of the semiconductor element to be mounted.

On the other hand, the main surface of the semiconductor element 4 where the outside connection terminals 5 are provided is made to face the supporting board 1 and the semiconductor element 4 is suctioned and held by a suction tool 7. Hole forming parts 9 are provided in the circumference of the suctioning part 8 of the suction tool 7 configured to take suction on the semiconductor element 4. See FIG. 2(a).

While the compressed air W is jetted from the hole forming parts 9 of the suction tool 7, the suction tool 7 is lowered so that the semiconductor element 4 is fixed on the supporting board 1 via the adhesive 2 and the outside connection terminals 5 of the semiconductor element 4 and the electrode terminals 3 of the supporting board 1 are connected to each other. See FIG. 2(b).

At this time, since the compressed air W is jetted from the hole forming parts 9 of the suction tool 7 to the circumference, the adhesive 2 is made to spread and flow to the circumference of the semiconductor element 4. As a result of this, it is possible to prevent the adhesive 2 from creeping up along side surfaces of the semiconductor element 4 so that adhesion of the adhesive 2 to the suction tool 6 can be prevented.

After that, the suctioning of the semiconductor element 4 by the suction tool 7 is turned off and the suction tool 7 is raised. See FIG. 2(c). At this time, jetting of the compressed air W from the hole forming parts 9 of the suction tool 7 is stopped.

In the related art shown in FIG. 1, at the time when the suctioning of the semiconductor element 4 by the suction tool 6 is turned off, the compressed air W is jetted from the suctioning part 7 of the suction tool 6 to the circumference. On the other hand, in the related art shown in FIG. 2, while the compressed air W is jetted from the hole forming parts 9 of the suction tool 7 to the circumference, the suction tool 7 is lowered.

Because of this, as shown in parts surrounded by dotted lines in FIG. 1(c) and FIG. 2(c), due to the jetted compressed air W, the configuration pattern of the adhesive provided on a surface of a neighboring or adjacent semiconductor element mounting expected part S where the semiconductor element is not yet mounted may be deformed. In other words, an offset may be formed in the volume distribution of the adhesive 2 at the semiconductor element mounting expected part S.

As a result of this, when the semiconductor element 4 is mounted on the semiconductor element mounting expected part S, the adhesive 2 on the semiconductor element mounting expected part S cannot be equally spread.

Because of this, at a part where the volume distribution of the adhesive 2 is small, a void or non-filling part is generated. This may cause the semiconductor element 4 to be inclined and fixed when the adhesive 2 is cured after the semiconductor element 4 is mounted.

On the other hand, at a part where the volume distribution of the adhesive 2 is large, when the semiconductor element 4 is fixed, the adhesive 2 is spread and flows to the circumference of the semiconductor element 4. As a result of this, the adhesive 2 which flows out creeps up along the side surfaces of the semiconductor element 4 so as to be adhered to the suction tool.

SUMMARY OF THE INVENTION

According to one aspect of embodiment, a method for mounting electronic components, including a step of providing an adhesive on each of plural electronic component mounting parts on a wiring board; and a step of fixing one of the electronic components on each of the plural electronic component mounting parts via the adhesive; wherein, when the adhesive is provided on each of the plural electronic component mounting parts, the center of gravity of a volume of the adhesive provided on the mounting part where an Nth electronic component is to be mounted is shifted in a direction closer to the mounting part where an (N minus 1 or greater)th electronic component is provided neighboring and adjacent to the mounting part where the Nth electronic component is to be mounted is provided.

According to another aspect of the embodiment, a method for mounting electronic components, including a step of providing an adhesive on each of plural electronic component mounting parts on a wiring board; and a step of fixing one of the electronic components on each of the plural electronic component mounting parts via the adhesive; wherein, when the adhesive is provided on each of the plural electronic component mounting parts, the center of gravity of a volume of the adhesive provided on the mounting part where an Nth electronic component is to be mounted is provided corresponding to compressed air jetted from a suction tool when an (N minus 1 or greater)th electronic component is mounted, is provided.

According to other aspect of the embodiment, a method for mounting electronic components, including a step of providing an adhesive on each of plural electronic component mounting parts on a wiring board; and a step of fixing one of the electronic components on each of the plural electronic component mounting parts via the adhesive; wherein, when the adhesive is provided on each of the plural electronic component mounting parts, the center of gravity of a volume of the adhesive provided on the mounting part where an Nth electronic component is to be mounted is shifted in a direction of a sum of vectors to centers of the areas of plural mounting parts where (N minus 1 or greater)th electronic components are mounted adjacent to the mounting part where the Nth electronic component is mounted, is provided.

According to other aspect of the embodiment, a method for mounting electronic components, including a step of providing an adhesive on each of plural electronic component mounting parts on a wiring board; and a step of fixing one of the electronic components on each of the plural electronic component mounting parts via the adhesive; wherein a center of gravity of a volume of an adhesive provided on a mounting part where one of the electronic components is to be mounted is situated corresponding to a compressed air jetted from a suction tool when other electronic components are mounted before the one of the electronic components is mounted, is provided.

BRIEF DESCRIPTION OF THE DRAWINGS

FIG. 10 is a plan view showing a second modified example of the forming patterns of the adhesives on the mounting parts S1 through S5;

DETAILED DESCRIPTION OF THE PREFERRED EMBODIMENTS

A description is given below, with reference to the FIG. 3 through FIG. 20, of embodiments of the present invention.

In the following explanation, the embodiments of the present invention are discussed by using semiconductor elements as electronic components and wiring boards as supporting boards.

First Embodiment of the Present Invention

A method for mounting electrical components on a wiring board of a first embodiment of the present invention is discussed with reference to FIG. 3.

In the first embodiment of the present invention, plural semiconductor elements are mounted on a single wiring board along a longitudinal direction of the wiring board.

In other words, five rectangular-shaped mounting parts S1 through S5 where semiconductor elements are to be mounted are provided on a main surface of a wiring board 10 in a single line in a longitudinal direction of the wiring board 10. See FIG. 3(a).

The wiring board 10 is made of, for example, an organic insulation material such as polyimide, glass BT (bismaleimide-triazine), or glass epoxy, an inorganic material such as ceramic, or a semiconductor material such as silicon (Si). In addition, an electrode (outside connection terminal) and a wiring layer are formed on the surface of or inside the wiring board 10.

As shown by dotted lines in FIG. 3(a), the mounting parts S1 through S5 have the substantially same configurations and areas.

Plural outside connection terminals 11-1 through 11-5 made of copper (Cu) are provided in lines and separately from each other at the mounting parts S1 through S5. Gold (Au) plating is formed on the surfaces of the outside connection terminals 11-1 through 11-5. Materials forming the outside connection terminals 11-1 through 11-5 are properly selected based on the semiconductor elements to be mounted.

In the wiring board 10, the semiconductor elements are mounted on the mounting part S1, the mounting part S2, the mounting part S3, the mounting part S4, and the mounting part S5, in this order, For mounting the semiconductor elements, paste adhesives 12 (12-1 through 12-5) are selectively provided on the mounting parts S1 through S5 in advance. See FIG. 3(b).

Since the mounting parts S1 through S5 have substantially rectangular-shaped configurations, it is possible to easily arrange the configurations of the adhesives 12.

A material for the adhesive 12 is properly selected based on a flip-chip method applied for a step for mounting the semiconductor elements. For example, epoxy resin, polyimide resin, acrylic resin, silicon resin, or other thermosetting insulation resin can be used as the material for the adhesive 12. The adhesive 12 may contain conductive fine articles such as silver (Ag), solder, or nickel (Ni).

Figure 5:
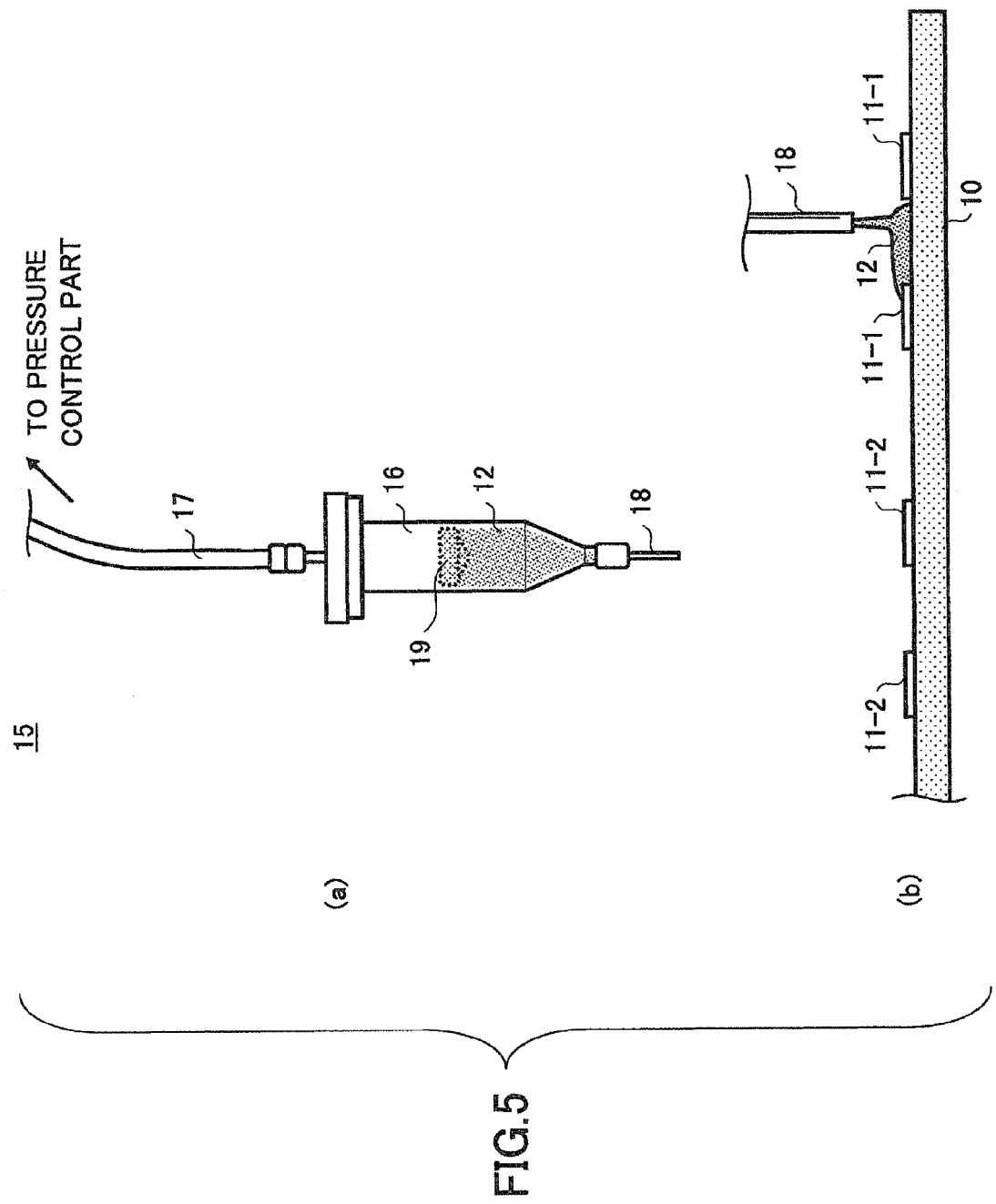
FIG. 5 is a view showing a method for providing adhesives to mounting parts S.

The adhesives 12 are provided and formed on the mounting parts S1 through S5 by a so-called dispensing method shown in FIG. 5.

In other words, the adhesives 12 are selectively provided and formed on the mounting parts S1 through S5 by the dispensing method using a dispenser 15 having a jetting part shown in FIG. 5(a). See FIG. 5(b). In the dispenser 15, an air pumping method is applied so that a jetting amount of the adhesive 12 is controlled by air pressure.

In other words, the adhesive 12 is stored in a syringe 16 of the dispenser 15 in advance. Air at a designated pressure is sent to the syringe 16 via a tube 17 connected to a pressure control part (not shown) so that a piece part 19 provided on the adhesive 12 and in the syringe 16 is compressed. As a result of this, the adhesive 12 is jetted from a needle 18 by the piece part 19 moving downward.

According to such a dispensing method, the jetting amount of the adhesive 12 can be controlled with high precision so that a minute pattern of the adhesive 12 can be easily formed. Therefore, this method is effective in a case where a thin or small semiconductor element is mounted on the mounting part S of the wiring board 10.

Instead of the air pumping type dispensing method, a so-called weight control type dispensing method can be applied so that the jetting amount of the adhesive 12 from the dispenser 15 is controlled by directly and mechanically controlling the piece part 19 provided on the upper surface of the adhesive 12.

In addition, a robot dispenser having a mechanism for controlling movement of the jetting part in a horizontal direction and upper and lower directions, a mechanism for controlling movement in a horizontal direction of a stage where a subject to be jetted is mounted, a mechanism for controlling the jetting amount and jetting timing, a mechanism for programming an operations sequence where the moving method and the jetting method are combined, and a mechanism for performing the operations sequence by following the program, may be used.

It is possible to form the patterns of the adhesives 12 with high precision by applying the dispensing method using such a robot dispenser. In addition, according to the robot dispenser method, by registering drawing patterns in advance, it is possible to easily select and switch various kinds of the patterns.

Next, pattern configurations of the adhesives 12-1 through 12-5 provided and formed in the mounting parts S1 through S5 are discussed with reference to FIG. 3(*b*).

As discussed above, the mounting part S1 is substantially rectangular-shaped. The outside connection terminals are provided on two sides of the mounting part S1 facing to each other. The adhesive 12-1 is provided from the substantially center part of the mounting part S1 along diagonal lines of the rectangular-shaped configuration so that the adhesive 12-1 has a X-shaped and substantially point symmetrical-shaped configuration.

In other words, the adhesive 12-1 is provided along the diagonal lines of the mounting part S1 and the provided amount of the adhesive 12-1 in the center part of the mounting part S1 is greatest.

Figure 1:
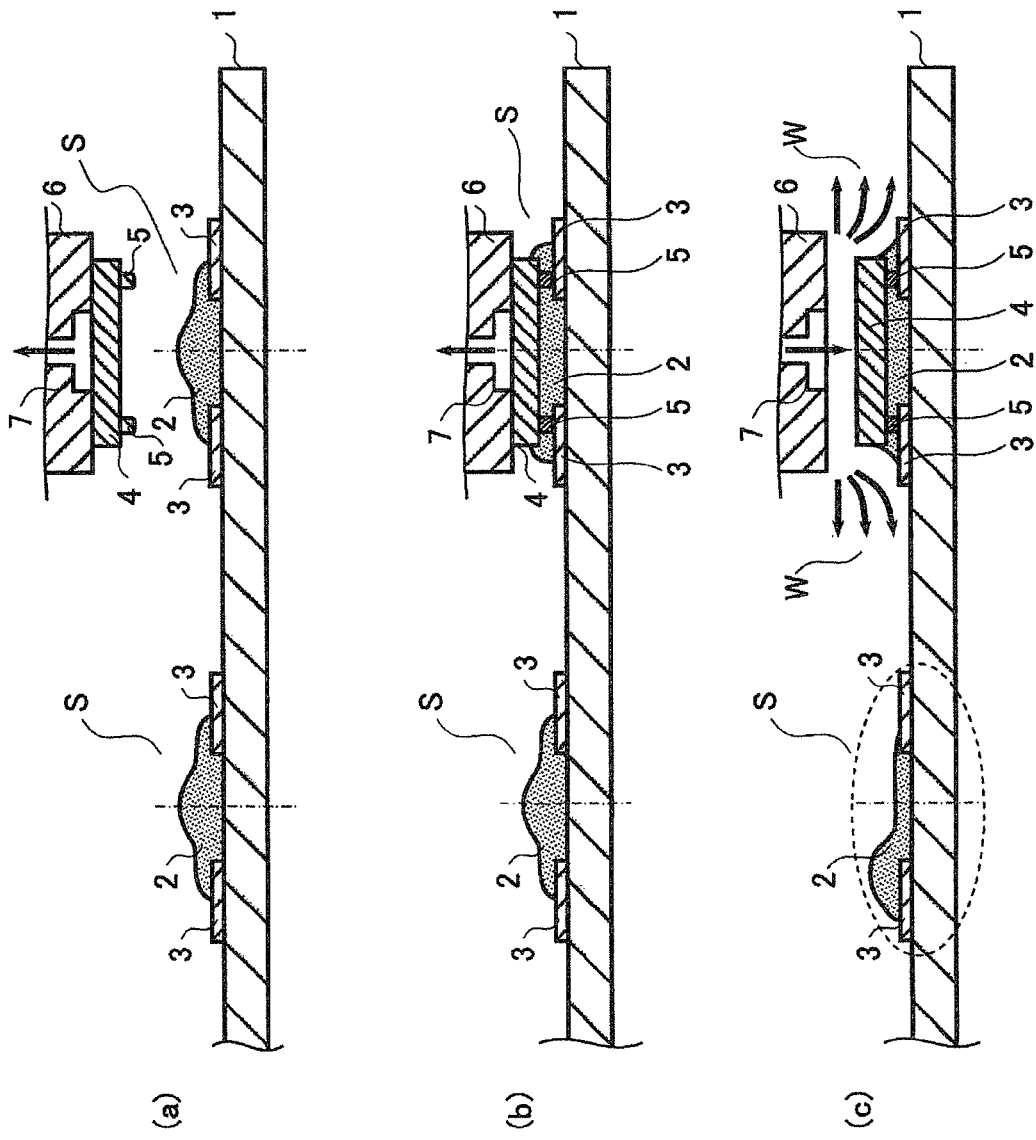
FIG. 1 is a first cross-sectional view showing a related art method for mounting semiconductor elements on a wiring board.
Figure 2:
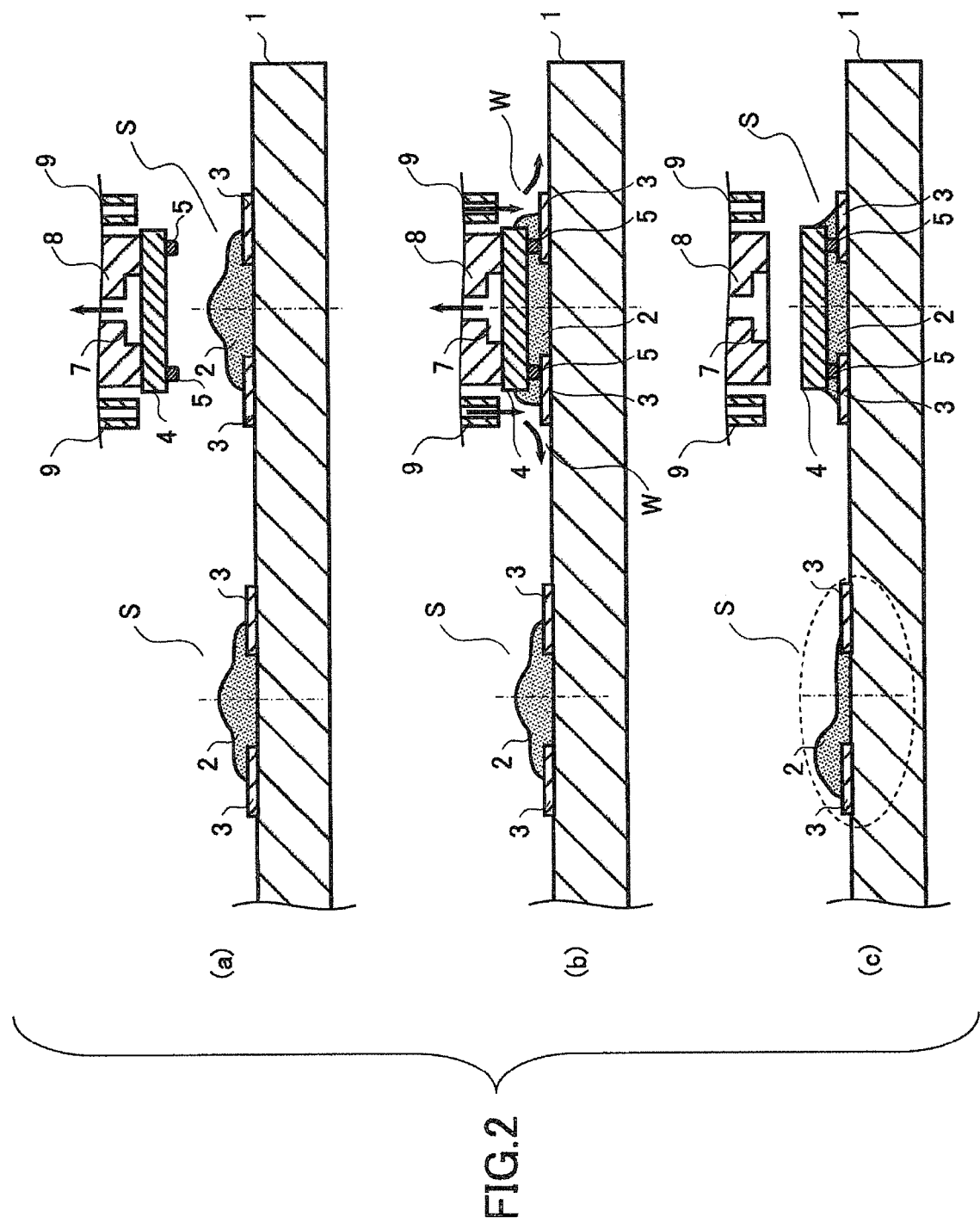
FIG. 2 is a second cross-sectional view showing the related art method for mounting the semiconductor elements on the wiring board.
Figure 3:
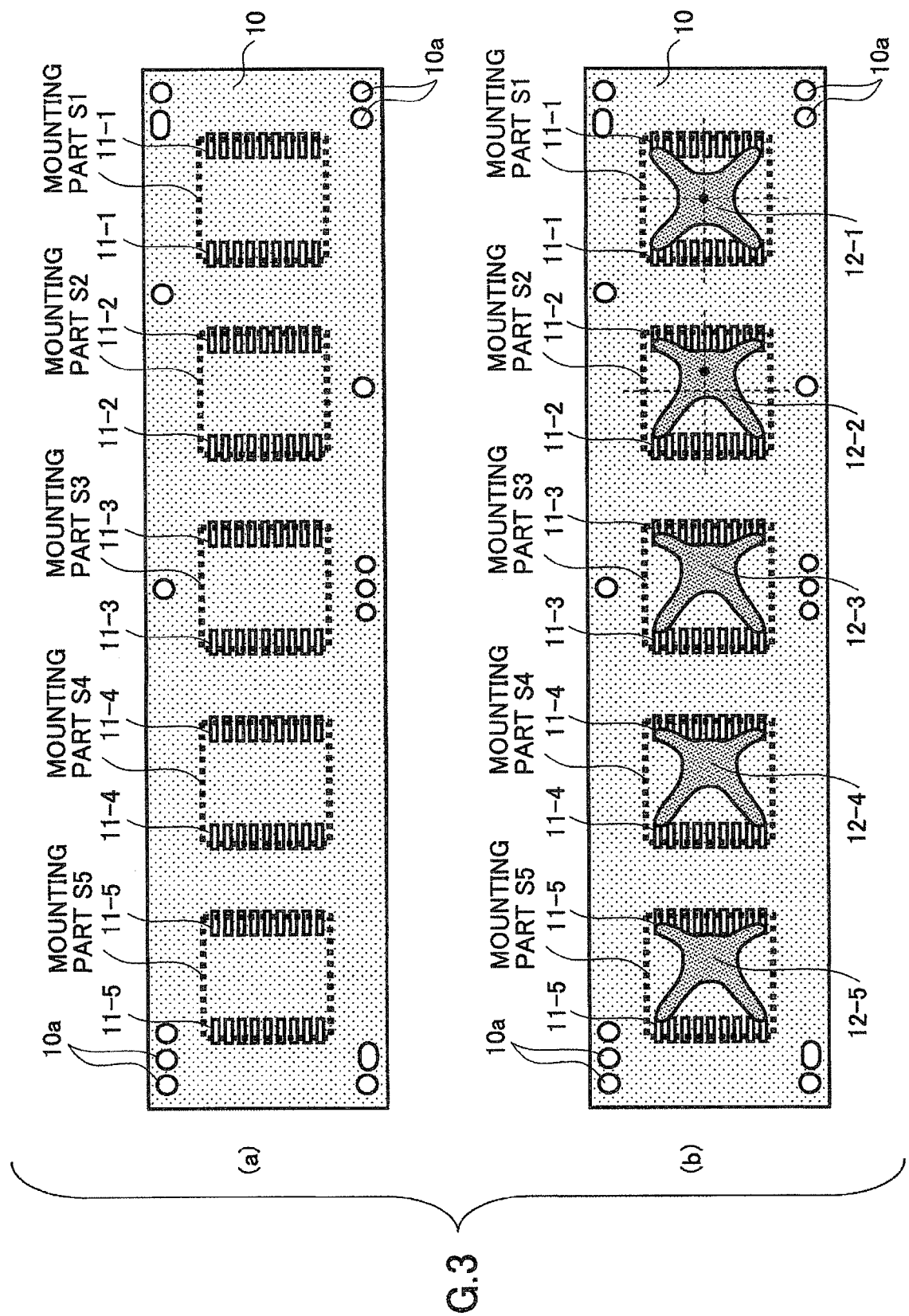
FIG. 3 is a first plan view showing a method for mounting electronic components on a wiring board of a first embodiment of the present invention.

Accordingly, in the mounting part S1, the center of gravity of the adhesive 12-1 (indicated by a black color circle in the adhesive 12-1 in FIG. 3(*b*)) is positioned in the center part of the mounting part S1.

The provided amount of the adhesive 12-1 in the center part of the mounting part S1 is greatest so that the center of gravity of the volume of the adhesive 12-1 is positioned in the center of the mounting part S1. Therefore, when the semiconductor element is fixed on the mounting part S1, the adhesive 12-1 is easily and equally expanded in the entire area of the mounting part S1.

On the other hand, the adhesives 12-2 through 12-5 provided on the mounting parts S2 through S5 have pattern configurations different from the provided pattern on the adhesive 12-1 formed on the mounting part S1.

In this embodiment, the adhesives 12-2 through 12-5 provided on the mounting parts S2 through S5 have the substantially same patter configurations. Accordingly, explanations of the adhesives 12-3 through 12-5 formed on the mounting parts S3 through S5 are omitted by explaining the adhesive 12-2 formed on the mounting part S2.

On the mounting part S2, the adhesive 12-2 is provided along diagonal lines of the rectangular-shaped mounting part S2. The provided amount of the adhesive 12-2 on a portion shifted to a side of the mounting part S1 (right side in FIG. 3(*b*)) from the center part of the mounting part S2 is greatest.

In other words, in the mounting part S2, the center of gravity of the adhesive 12-2 (indicated by a black color circle in the adhesive 12-2 in FIG. 3(*b*)) is positioned on the portion shifted to the side of the mounting part S1 from the center part of the mounting part S2.

Thus, the provided amount of the adhesive on the portion shifted to the side of the mounting part S1 (right side in FIG. 3(*b*)) from the center part of the mounting part S2 is greatest, so that the center of gravity of the adhesive 12-2 (indicated by a black color circle in the adhesive 12-2 in FIG. 3(*b*)) is positioned on the portion shifted to the side of the mounting part S1 from the center part of the mounting part S2.

As a result of this, when the semiconductor element is fixed onto the mounting part S1, the adhesive 12-2 moves in a direction far from the mounting part S1 due to the compressed air jetted from the suction tool so that the center of gravity of the volume of the adhesive 12-2 is moved to the center part of the mounting part S2.

If the pattern configuration of the adhesive 12-2 provided on the mounting part S2 is the same as that of the adhesive 12-1 on the mounting part S1, the volume distribution of the adhesive 12-2 is shifted to a side of the mounting part S3 due to the compressed air jetted from the suction tool when the semiconductor element is mounted on the mounting part S1.

The arrangement of the adhesive 12-2 on the mounting part S2 is applied to arrangements of the adhesives 12 on the mounting parts S3 through S5. This is because when the semiconductor element is mounted on a mounting part S-n, the compressed air operates on an adhesive 12-(*n*+1) on a neighboring mounting part S-(n+1) where the semiconductor is to be mounted next.

Figure 6:
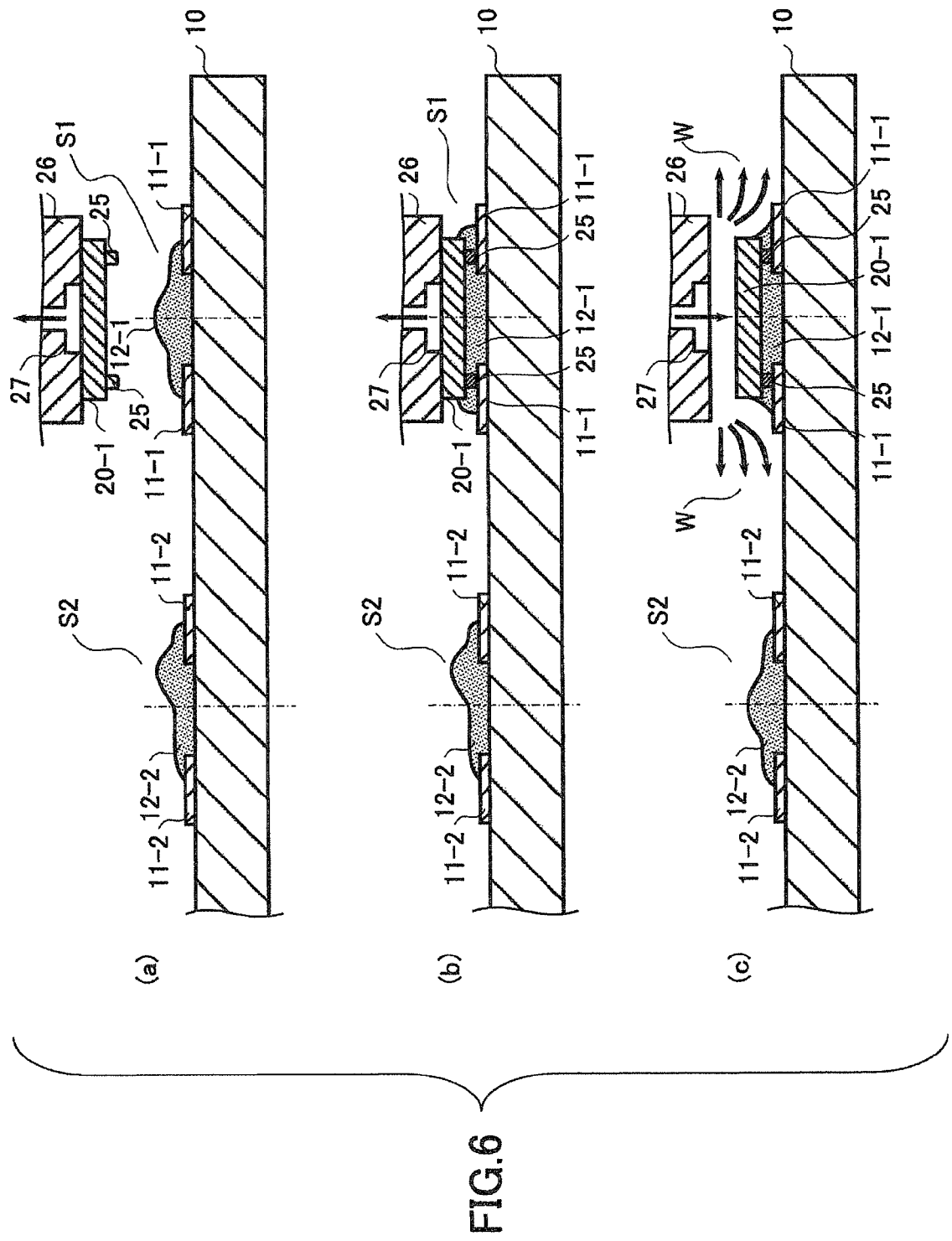
FIG. 6 is a first cross-sectional view showing a method for mounting a semiconductor element 20-1 via an adhesive 12-1 on a mounting part S1.

A method shown in FIG. 6 is applied to a step for mounting and fixing a semiconductor element 4 on the wiring board 10.

First, above the mounting part S1, a semiconductor element 20-1 is suctioned and held by an suction tool 26 where a surface of the semiconductor element 20-1 where outside connection terminals 25 are formed faces down. The outside connection terminals 25 called bumps of the semiconductor element 20-1 are formed by convex-shaped electrodes. In addition, the outside connection terminals 25 of the semiconductor element 20-1 and the outside connection terminals 11-1 of the wiring board 10 are made to face each other so that positioning is achieved. See FIG. 6(*a*). At this time, the wiring board 10 is held on a stage (not shown).

In order to suction and hold the semiconductor element 20-1, the inside of a suctioning part 27 of the suction tool 26 is a negative pressure. The negative pressure is maintained until suctioning of the semiconductor element 20-1 by the suction tool 26 is turned off. See an arrow in FIG. 6(*a*).

At this time, the center of gravity of the adhesive 12-2 provided on the mounting part S2 is positioned on the portion shifted to the side of the mounting part S1 from the center part of the mounting part S2.

Materials forming the outside connection terminals 25 of the semiconductor element 20-1 are properly selected, depending on the mounting method, from gold (Au), copper (Cu), an alloy thereof, tin (Sn)—silver (Ag) solder, tin (Sn)—silver (Ag)—copper (Cu) solder, and others.

Next, the suction tool 26 is lowered while a main surface of the semiconductor element 20-1 and a main surface of the wiring board 10 are in parallel with each other, and thereby the semiconductor element 20-1 is fixed on the wiring board 10 via the adhesive 12-1. At the same time, the outside connection terminals 25 of the semiconductor element 20-1 and the outside connection terminals 11-1 of the wiring board 10 are connected to each other. See FIG. 6(*b*).

The suction tool 26 has a heating part (not shown). Accordingly, in a case where the adhesive 12-1 is made of thermosetting resin, the suction tool 26, while heating the suctioned semiconductor element 20-1 at approximately 250° C. through 300° C., is lowered. As a result of this, it is possible to fix the semiconductor element 20-1 on the wiring board 10 at the same time the semiconductor element 20-1 is being mounted on the mounting part S1.

As discussed above, the provided amount of the adhesive 12-1 is greatest in the center part of the mounting part S1. Accordingly, the center of the gravity of the volume of the adhesive 12-1 is positioned in the center part of the mounting part S1. Because of this, in this step, when the semiconductor element 20-1 is mounted on the mounting part S1, the adhesive 12-1 can be easily and equally (evenly) spread in the entire area of the mounting part S1. Therefore, it is possible to securely fix the semiconductor element 20-1 on the wiring board 10.

After that, the suctioning of the semiconductor element 20-1 by the suction tool 26 is turned off. See FIG. 6(*c*).

At this time, in order to securely turn off the suctioning of the semiconductor element 20-1 by the suction tool 26, the inside of the suctioning part 27 of the suction tool 26 is switched from negative pressure to positive pressure so that compressed air W such as dried nitrogen ($N_2$) gas is jetted from the suctioning part 27 to the circumference. See the arrows in FIG. 6(c).

Due to jetting of the compressed air W, the adhesive 12-2 provided on the neighboring mounting part S2 is moved in a direction far from the mounting part S1 so that the center of gravity of the volume of the adhesive 12-1 moves to the center part of the mounting part S2.

After that, the suction tool 26 is raised.

Thus, in order to securely turn off the suctioning of the semiconductor element 20-1 by the suction tool 26, the compressed air W is jetted from the suctioning part 27 so that the adhesive 12-2 provided on the neighboring mounting part S2 is moved in a direction far from the mounting part S1 so that the center of gravity of the volume of the adhesive 12-1 is moved to the center part of the mounting part S2.

Figure 7:
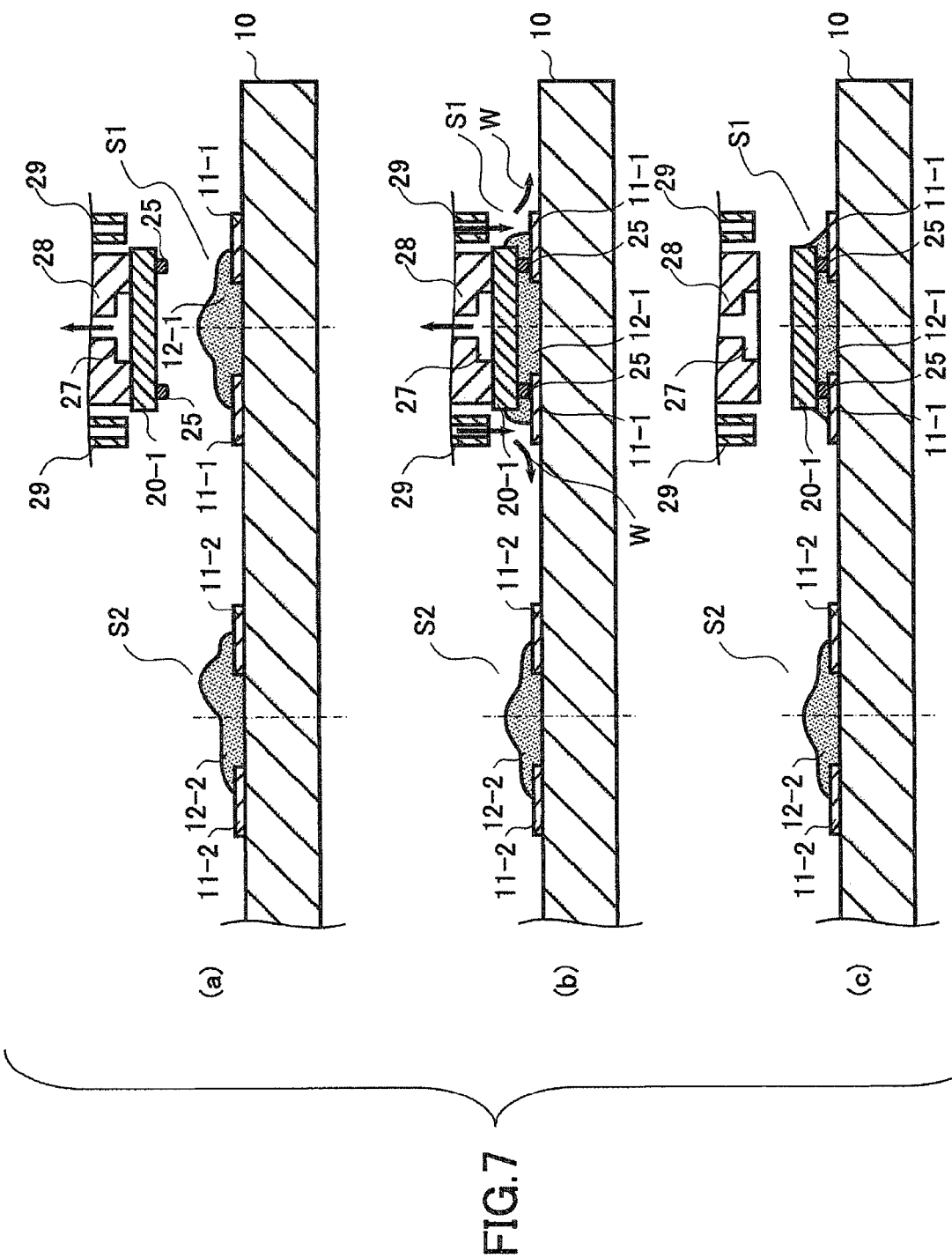
FIG. 7 is a second cross-sectional view showing the method for mounting the semiconductor element 20-1 via the adhesive 12-1 on the mounting part S1.
Figure 8:
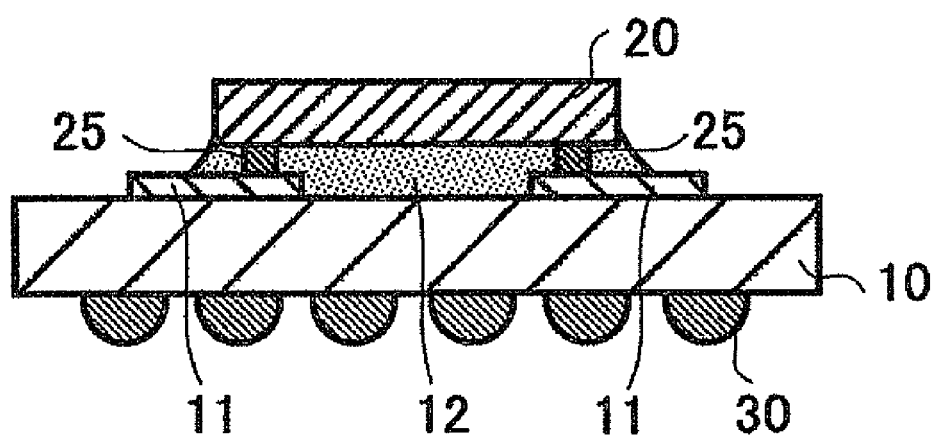
FIG. 8 is a cross-sectional view of a semiconductor device made by using a method of the first embodiment of the present invention.

In addition, a method shown in FIG. 7 may be applied in the step for mounting and fixing the semiconductor element 4 to the wiring board 10. In FIG. 7, parts that are the same as the parts shown in FIG. 6 are given the same reference numerals, and explanation thereof is omitted.

Hole forming parts 29 are provided in the circumference of the suctioning part 27 of the suction tool 28 configured to absorb the semiconductor element 20-1 shown in FIG. 7. As discussed below, the compressed air is jetted from the hole forming parts 29.

A main surface of the semiconductor element 20-1 where the outside connection terminals 25 are provided is made to face the wiring board 10 and the semiconductor element 20-1 is suctioned and held by the suction tool 26. The outside connection terminals 25 of the semiconductor element 20-1 and the outside connection terminals 11-1 of the wiring board 10 are made to face each other so that positioning is achieved. See FIG. 7(a). At this time, the wiring board 10 is supported on a stage (not shown).

In order to take suction on and hold the semiconductor element 20-1, the inside of a suctioning part 27 of the suction tool 26 is at negative pressure. The negative pressure is maintained until suctioning of the semiconductor element 20-1 by the suction tool 26 is turned off. See an arrow in FIG. 7(a).

At this time, on the wiring board 10, the center of gravity of the volume of the adhesive 12-2 provided on the mounting part S2 is positioned in a portion shifted from the center part to the right side, namely at the side of the mounting part S1.

Next, the suction tool 28 having the hole forming parts 29 jetting the compressed air W such as dried nitrogen ($N_2$) gas to the circumference is lowered while a main surface of the semiconductor element 20-1 and a main surface of the wiring board 10 are in parallel with each other, and thereby the semiconductor element 20-1 is mounted on the mounting part S1 and fixed on the wiring board 10.

As discussed above, the provided amount of the adhesive 12-1 in the center part of the mounting part S1 is greatest so that the center of gravity of the volume of the adhesive 12-1 is positioned in the center of the mounting part S1. Therefore, when the semiconductor element 20-1 is fixed on the mounting part S1, the adhesive 12-1 is easily and equally expanded in the entire area of the mounting part S1. Hence, it is possible to securely fix the semiconductor element 20-1 on the wiring board 10.

When the semiconductor element 20-1 is pressed, the adhesive 12-1 is spread so as to flow to the circumference of the semiconductor element 20-1. However, since the compressed air W is jetted to the circumference of the semiconductor element 20-1 from the hole forming parts 29 of the suction tool 28, the adhesive 12-1 does not creep up the side surfaces of the semiconductor element 20-1 and is not adhered to the suction tool 28.

Based on the jet of the compressed air W, the adhesive 12-2 provided on the neighboring mounting part S2 is moved in a direction far from the mounting part S1 so that the center of gravity of the volume of the adhesive 12-2 is moved to the center part of the mounting part S2.

After that, the suctioning of the semiconductor element 20-1 by the suction tool 28 is turned off and the suction tool 28 is raised. See FIG. 7(c). At this time, jetting of the compressed air from the hole forming parts 29 of the suction tool 28 is stopped.

In order to securely turn off the suctioning of the semiconductor element 20-1 by the suction tool 28, the inside of the suctioning part 27 of the suction tool 28 that is at negative pressure may be switched to a positive pressure so that dried nitrogen ($N_2$) gas is jetted from the suctioning part 27 to circumference.

After that, the suction tool 28 is raised.

Thus, the compressed air W is jetted from the hole forming parts 29 so that the adhesive 12-2 provided on the neighboring mounting part S2 is moved in a direction far from the mounting part S1 and the center of gravity of the volume of the adhesive 12-2 moves to the center part of the mounting part S2.

According to the above-discussed method, the semiconductor element 20-1 is fixed to the mounting part S1 via the adhesive 12-1.

At this time the wiring board 10 and the adhesive 12 are heated by a stage where the wiring board 10 is provided. The adhesive 12 is heated at approximately 50 through 100° C. by heat of the stage and thereby the viscosity of the adhesive 12 is decreased and flowing capacities of the adhesive 12 can be improved.

Thus, when the semiconductor elements 20-1 through 20-5 are mounted on the mounting parts S1 through S5 via the adhesive 12-1 through 12-5, the adhesive 12 can be easily spread on the entire adhered surfaces of the semiconductor devices 20.

A state where the semiconductor element 20-1 is mounted and fixed by the method shown in FIG. 6 or FIG. 7 on the mounting part S1 of the wiring board 10 shown in FIG. 3(b) is shown in FIG. 4(c).

In this state, the center of gravity of the adhesive 12-2 provided on the mounting part S2 neighboring to the mounting part S1 moves to the center part of the mounting part S2 (indicated by a black color circle in the adhesive 12-2 in FIG. 4(c)).

Next, when the semiconductor element 20-2 is fixed to the mounting part S2 in the next step, the adhesive 12-2 is spread to the entire area of the mounting part S2 so that the semiconductor element 20-2 can be securely fixed.

On the other hand, the centers of gravities of the volumes of the adhesives 12-3 through 12-5 provided to the mounting parts S3 through S5 remain positioned in parts shifted from the center parts of the mounting parts S to the side of the mounting part S1.

This is because the adhesive 12-2 on the mounting part S2 works as a block against the flow of the compressed air W jetted from the suction tool 26 or 28 so that the compressed air W does not effect on the adhesives 12-3 through 12-5.

Next, the semiconductor element 20-2 is mounted and fixed on the mounting part S2 via the adhesive 12-2. The same method as that discussed with reference to FIG. 6 or FIG. 7 is used for mounting and fixing the semiconductor element 20-2. See FIG. 4(d).

As discussed above, the center of gravity of the volume of the adhesive 12-2 provided on the mounting part S2 moves to the center part of the mounting part S2. Because of this, the provided amount of the adhesive 12-2 on the center part of the mounting part S2 is greatest.

Accordingly, when the semiconductor element 20-2 is fixed to the mounting part S2, the adhesive 12-2 is spread to the entire area of the mounting part S2 so that the semiconductor element 20-2 can be securely fixed. In the fixing step of the semiconductor element 20-2, the adhesive 12-3 provided on the mounting part S3 neighboring or adjacent to the mounting part S2 and positioned in a part shifted from the center part of the mounting part S3 to the sides of the mounting parts S1 and S2 moves to the center part of the mounting part S3 due to the compressed air W jetted from the suction tool 26 or 28 so that the center of gravity of the volume of the adhesive 12-3 moves to the center part of the mounting part S3.

Accordingly, in the next step, when the semiconductor element 20-3 is fixed to the mounting part S3, the adhesive 12-3 is spread to the entire area of the mounting part S3 so that the semiconductor element 20-3 can be securely fixed.

On the other hand, the centers of gravities of the volumes of the adhesives 12-4 and 12-5 provided to the mounting parts S4 and S5 remain positioned in parts shifted from the center parts of the mounting parts S to the side of the mounting part S1.

This is because the adhesive 12-3 on the mounting part S3 works as a block against the flow of the compressed air W jetted from the suction tool 26 or 28 so that the compressed air W almost does not affect the adhesives 12-4 and 12-5.

Next, the semiconductor element 20-4 is mounted and fixed on the mounting part S4 via the adhesive 12-4 and the semiconductor element 20-5 is mounted and fixed on the mounting part S5 via the adhesive 12-5, by the same method. See FIG. 4(e).

Thus, when the semiconductor elements 20 are mounted on the mounting parts S1 through S5, the adhesives 12 are spread to the entire area of the mounting parts S1 through S5 so that the semiconductor elements 20 can be fixed on the wiring board 10.

Accordingly, it is possible to prevent generation of a small part in the volume distribution of the adhesive 12 and to avoid generation of a void or not-filling part or generation of a situation where the semiconductor element 20 is obliquely fixed.

After that, plural outside connection terminals 30 such as solder electrodes made of tin (Sn)—silver (Ag) solder or tin (Sn)—silver (Ag)—copper (Cu) are provided on another main surface (rear surface) of the wiring board 10 where plural semiconductor elements 20 are mounted and fixed.

Then, the wiring board 10 is cut by a dicing blade or the like so that pieces of the mounting parts S are formed (piece forming process).

Thus, a semiconductor device 31 where the semiconductor element 20 is mounted on the wiring board 10 by the flip-chip method is formed. See FIG. 8.

If a sealing process is necessary for the semiconductor element 20, for example, a resin sealing process is performed on a surface of the wiring board 10 where the semiconductor elements 20 are mounted before the piece forming process is performed. After the resin sealing process, where the individual mounting part S is a unit, the wiring board 10 and a sealing resin part are cut separately in thickness directions so that the semiconductor device 13 which is resin sealed and made into pieces is formed.

Figure 4:
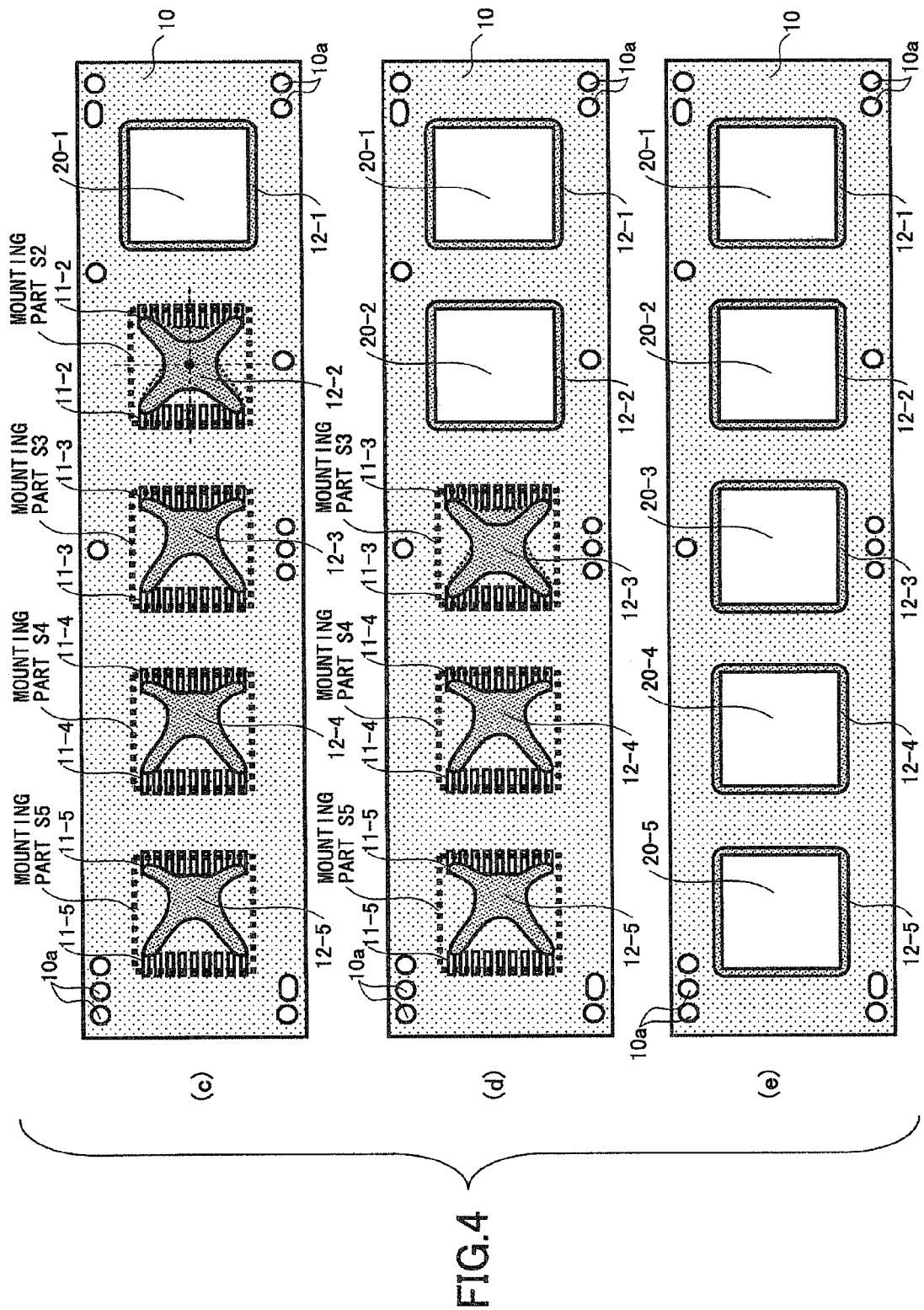
FIG. 4 is a second plan view showing the method for mounting the electronic components on the wiring board of the first embodiment of the present invention.

Openings shown in FIG. 3 and FIG. 4 can be used for positioning at the time when a cutting process and others are applied to the wiring board 10.

In this embodiment, the mounting part S1 of the wiring board 10 has the substantially rectangular-shaped configuration. The outside connection terminals 11-1 are provided at two sides facing to each other. The adhesive 12-1 has a substantially point-symmetrical configuration. More specifically, the adhesive 12-1 has a substantially X-shaped configuration where the adhesive 12-1 is formed along diagonals from the center part of the mounting part S1 having a rectangular configuration.

In other words, the adhesive 12-1 is formed along the diagonals of the mounting part S1 and the provided amount of the adhesive 12-1 on the center part of the mounting part S1 is greatest.

However, the configuration of the adhesive 12 is not limited to this example. The adhesive 12 may have a pattern configuration shown in FIG. 9 through 11, FIG. 13, or FIG. 14.

FIG. 9 through 11, FIG. 13, and FIG. 14 show modified examples of forming patterns of the adhesives on the mounting part S1 and other mounting parts S. In FIG. 9 through 11, FIG. 13, or FIG. 14, (a) shows a pattern configuration of the adhesive on the mounting part S1; (b) shows a pattern configuration of the adhesive on the other mounting part; and (c) shows a pattern configuration of the adhesive on a mounting part S after the compressed air is jetted to a neighboring or adjacent mounting part S.

Figure 9:
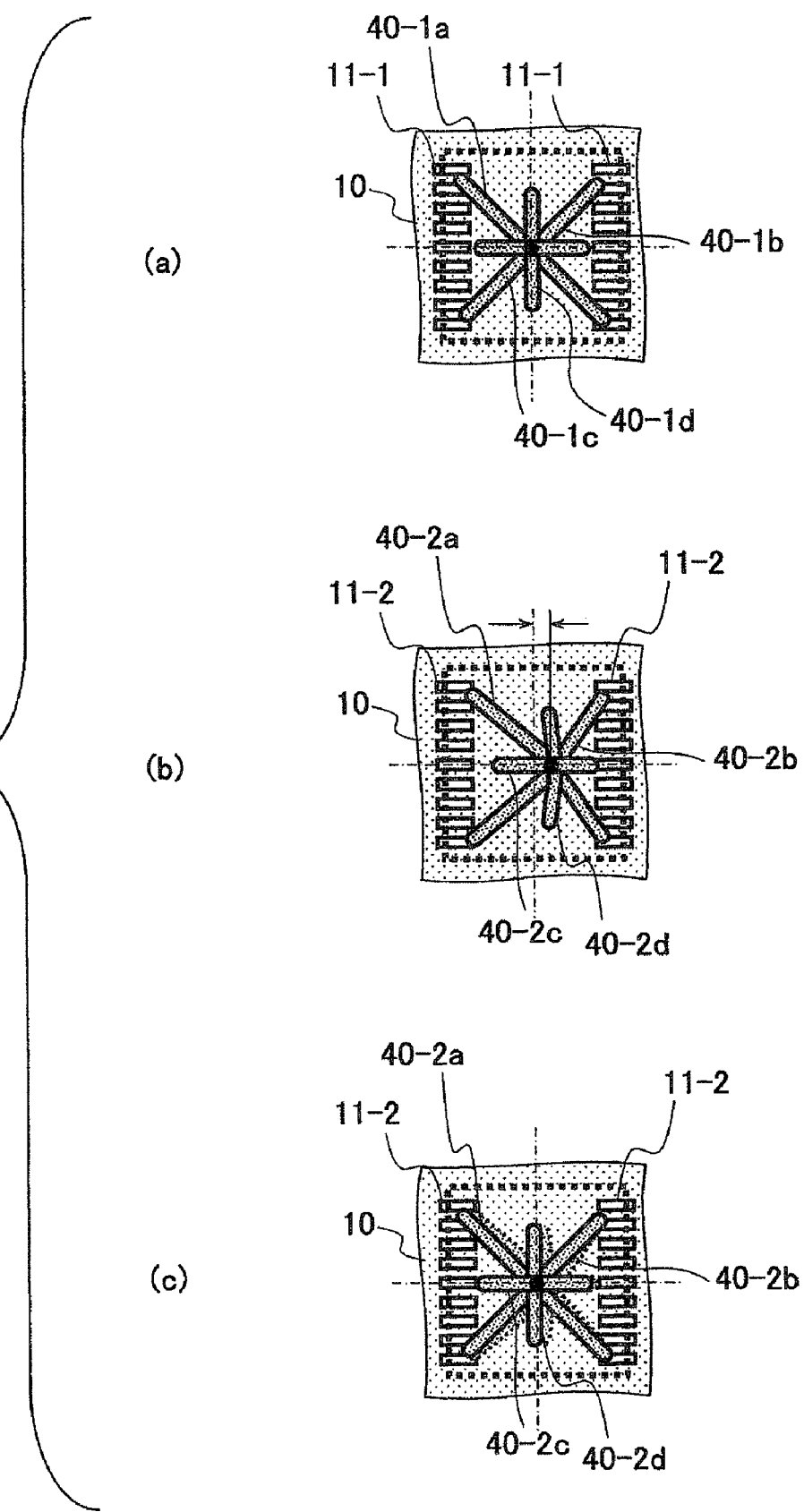
FIG. 9 is a plan view showing a first modified example of forming patterns of the adhesives on mounting parts S1 through S5.

A first modified example of a pattern configuration of the adhesive on the mounting part S is shown in FIG. 9.

In this modified example, the adhesive 40 is provided on the mounting part S having a rectangular-shaped configuration in a substantially symmetrical manner. In other words, adhesives 40-1$a$ and 40-1$b$ are provided along diagonals of the mounting part S1 so as to cross each other.

In addition, adhesives 40-1$c$ and 40-1$d$ provided between the middle points of two sides of the rectangular-shaped configuration facing each other are provided on the mounting part S1 so as to cross each other. The crossing point of the adhesives 40-1$c$ and 40-1$d$ is overlapped with the crossing point of the adhesives 40-1$a$ and 40-1$b$ situated in the substantially center part of the mounting part S1.

Under this structure, the provided amount of the adhesive 40-1 in the center part of the mounting part S1 is greatest so that the center of gravity of the volume of the adhesive 40-1 is positioned in the center of the mounting part S1 (indicated by a black color circle in the adhesive 40-1 in FIG. 9($a$)).

Thus, since the provided amount of the adhesive 40-1 in the center part of the rectangular-shaped configuration is greatest so that the center of gravity of the volume of the adhesive 40-1 is positioned in the center of the rectangular shaped configuration, when the semiconductor element 20-1 is fixed on the mounting part S1 in the step shown in FIG. 4($c$), the adhesive 40-1 is easily and equally expanded in the entire area of the mounting part S1.

On the other hand, the adhesive provided on the mounting parts S2 through S5 have pattern configurations different from the adhesive 40-1 formed on the mounting part S1. See FIG. 9($b$).

Since provided patterns of the adhesives formed on the mounting parts S2 through S5 have the same configurations, only a pattern configuration of the adhesive 40-2 provided on the mounting part S2 is discussed and explanations of the adhesives 40 provided on the mounting parts S3 through S5 are omitted.

The adhesive 40-2 provided on the mounting part S2 includes adhesives 40-2a, 40-2b, 40-2c, and 40-2d. The adhesives 40-2a and 40-2b cross each other. In addition, adhesives 40-2c and 40-2d provided between two sides of the rectangular-shaped configuration facing each other are provided on the mounting part S2 so as to cross each other. The crossing point of the adhesives 40-2c and 40-2d is overlapped with the crossing point of the adhesives 40-2a and 40-2b situated substantially center part of the mounting part S2.

In this state, the crossing point is formed so as to be shifted to a side of the mounting part S1 in FIG. 3. In other words, the center of gravity of the adhesive 40-2 is shifted from the center part of the mounting part S2 to the side of the mounting part S1 shown in FIG. 3 (a part indicated by a black color circle in the adhesive 40-2 in FIG. 9(b)).

Thus, according to such an providing arrangement, when the semiconductor element 20-1 is mounted on the mounting part S1 neighboring and adjacent to the mounting part S2, the adhesive 40-2 moves in a direction far from the mounting part S1 due to the compressed air jetted from the suction tool 26 or 28 (see FIG. 6 or FIG. 7) and the gravity of the center of the volume of the adhesive 40-2 moves to the center part of the mounting part S2. See FIG. 9(c).

Accordingly, when the semiconductor element 20-2 is fixed on the mounting part S2, the adhesive 40-2 is easily and equally expanded in the entire area of the mounting part S2 so that the semiconductor element 20-2 can be securely fixed on the wiring board 10.

A second modified example of a pattern configuration of the adhesive on the mounting part S is shown in FIG. 10.

In this modified example, the adhesive 45 is provided on the mounting part S having a rectangular-shaped configuration in a substantially symmetrical manner.

In other words, adhesives 40-1a and 40-1b are provided along diagonals of the mounting part S1 so as to cross each other.

That is to say, the line adhesives 45-1a and 45-1b are provided on the mounting part S1 along the diagonals of the mounting part S1 so as to cross each other. Furthermore, an adhesive 45-1c having a circular-shaped configuration is provided on the crossing point of the adhesives 45-1a and 45-1b situated substantially in the center of the mounting part S1. See FIG. 10(a).

Under this structure, the provided amount of the adhesive 45-1 in the center part of the mounting part S1 is greatest so that the center of gravity of the volume of the adhesive 45-1 is positioned in the center of the mounting part S1 having the rectangular-shaped configuration (indicated by a black color circle in the adhesive 45-1 in FIG. 10(a)).

Thus, since the provided amount of the adhesive 45-1 in the center part of the mounting part S1 having the rectangular-shaped configuration is greatest so that the center of gravity of the volume of the adhesive 45-1 is positioned in the center of the rectangular shaped configuration, when the semiconductor element 20-1 is fixed on the mounting part S1 in the step shown in FIG. 3(c), the adhesive 45-1 is easily and equally expanded in the entire area of the mounting part S1.

Since the providing pattern of the adhesive 45 is formed by linear adhesives 45-1a and 45-1b and a circular-shaped adhesive 45-1c, it is possible to easily control dispensing when the adhesive 45 is provided.

On the other hand, the adhesive provided on the mounting parts S2 through S5 have pattern configurations different from the adhesive 45-1 formed on the mounting part S1. See FIG. 10(b).

Since provided pattern of the adhesives formed on the mounting parts S2 through S5 have the same configurations, only a pattern configuration of the adhesive 45-2 provided on the mounting part S2 is discussed and explanations of the adhesive 40 provided on the mounting parts S3 through S5 are omitted.

The crossing points of the adhesives 45-2a and 45-2b and a part of the adhesive 45-2c stacked on the crossing points of the adhesives 45-2a and 45-2b are shifted to a side of the mounting part S1 shown in FIG. 3.

This arrangement is formed by providing the adhesives 45-2a and 45-2b in curved manners so that the crossing point of the adhesives 45-2a and 45-2b is shifted to the side of the mounting part S1 and then by providing the adhesive 45-2c on the crossing point.

In other words, the center of gravity of the adhesive 45-2 is shifted from the center part of the mounting part S2 to the side of the mounting part S1 shown in FIG. 3 (a part indicated by a black color circle in the adhesive 45-2 in FIG. 10(b)).

Thus, according to such an providing arrangement, when the semiconductor element 20-1 is mounted on the mounting part S1 neighboring and adjacent to the mounting part S2, the adhesive 45-2 moves in a direction far from the mounting part S1 due to the compressed air jetted from the suction tool and the center of gravity of the volume of the adhesive 45-2 moves to the center part of the mounting part S2. See FIG. 10(c).

Accordingly, when the semiconductor element 20-2 is fixed on the mounting part S2, the adhesive 45-2 is easily and equally expanded in the entire area of the mounting part S2 so that the semiconductor element 20-2 can be securely fixed on the wiring board 10.

Figure 11:
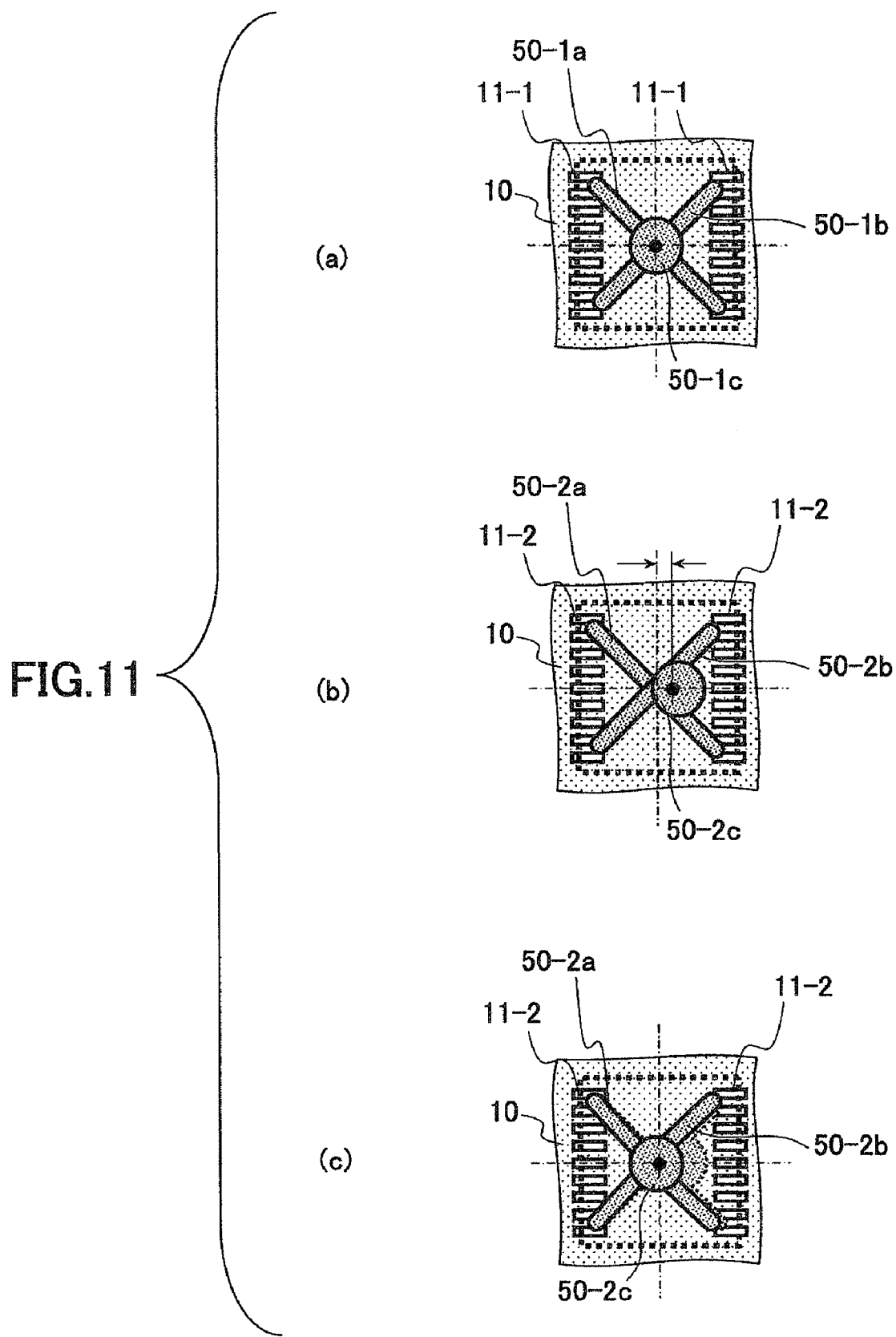
FIG. 11 is a plan view showing a third modified example of the forming patterns of the adhesives on the mounting parts S1 through S5.

A third modified example of a pattern configuration of the adhesive on the mounting part S is shown in FIG. 11.

In this modified example, the adhesive 50 is provided on the mounting part S in a substantially symmetrical manner.

In other words, adhesives 50-1a and 50-1b are provided along diagonals of the mounting part S1 so as to cross each other.

That is to say, the line adhesives 50-1a and 50-1b are provided on the mounting part S1 along the diagonals of the mounting part S1 so as to cross each other. Furthermore, an adhesive 50-1c having a circular-shaped configuration is provided on the crossing point of the adhesives 50-1a and 50-1b situated substantially in the center of the mounting part S1. See FIG. 11(a).

Under this structure, the provided amount of the adhesive 50-1 in the center part of the mounting part S1 is greatest so that the center of gravity of the volume of the adhesive 50-1 is positioned in the center of the mounting part S1 having the rectangular-shaped configuration (indicated by a black color circle in the adhesive 50-1 in FIG. 11(a)).

Thus, since the provided amount of the adhesive 50-1 in the center part of the mounting part S1 having the rectangular-shaped configuration is greatest so that the center of gravity of the volume of the adhesive 50-1 is positioned in the center of the rectangular shaped configuration, when the semiconductor element 20-1 is fixed on the mounting part S1 in the step shown in FIG. 4(c), the adhesive 50-1 is easily and equally expanded in the entire area of the mounting part S1.

Since the providing pattern of the adhesive 45 is formed by linear adhesives 50-1a and 50-1b and a circular-shaped adhesive 50-1c, it is possible to easily control dispensing when the adhesive 50 is provided.

On the other hand, the adhesive provided on the mounting parts S2 through S5 have pattern configurations different from the adhesive 50-1 formed on the mounting part S1. See FIG. 11(b).

Since provided patterns of the adhesives formed on the mounting parts S2 through S5 have the same configurations, only a pattern configuration of the adhesive 50-2 provided on the mounting part S2 is discussed and explanations of the adhesive 40 provided on the mounting parts S3 through S5 are omitted.

The crossing points of the adhesives 50-2a and 50-2b and a part of the adhesive 50-2c stacked on the crossing points of the adhesives 50-2a and 50-2b are shifted to a side of the mounting part S1 shown in FIG. 3.

This arrangement is formed by providing the adhesives 50-2a and 50-2b so that the adhesives 50-2a and 50-2b cross each other and the crossing point of the adhesives 50-2a and 50-2b is situated in the center of the mounting part S2 and then by providing the adhesive 50-2c so that the adhesive 50-2c is shifted to the side of the mounting part S1. In other words, the center of gravity of the adhesive 50-2 is shifted from the center part of the mounting part S2 to the side of the mounting part S1 (a part indicated by a black color circle in the adhesive 50-2 in FIG. 11(*b*)).

Thus, according to such an providing arrangement, when the semiconductor element 20-1 is mounted on the mounting part S1 neighboring and adjacent to the mounting part S2, due to the compressed air jetted from the suction tool, the center of gravity of the volume of the adhesive 45-2 moves to the center part of the mounting part S2. See FIG. 11(*c*).

Accordingly, when the semiconductor element 20-2 is fixed on the mounting part S2, the adhesive 50-2 is easily and equally expanded in the entire area of the mounting part S2 so that the semiconductor element 20-2 can be securely fixed on the wiring board 10.

Figure 12:
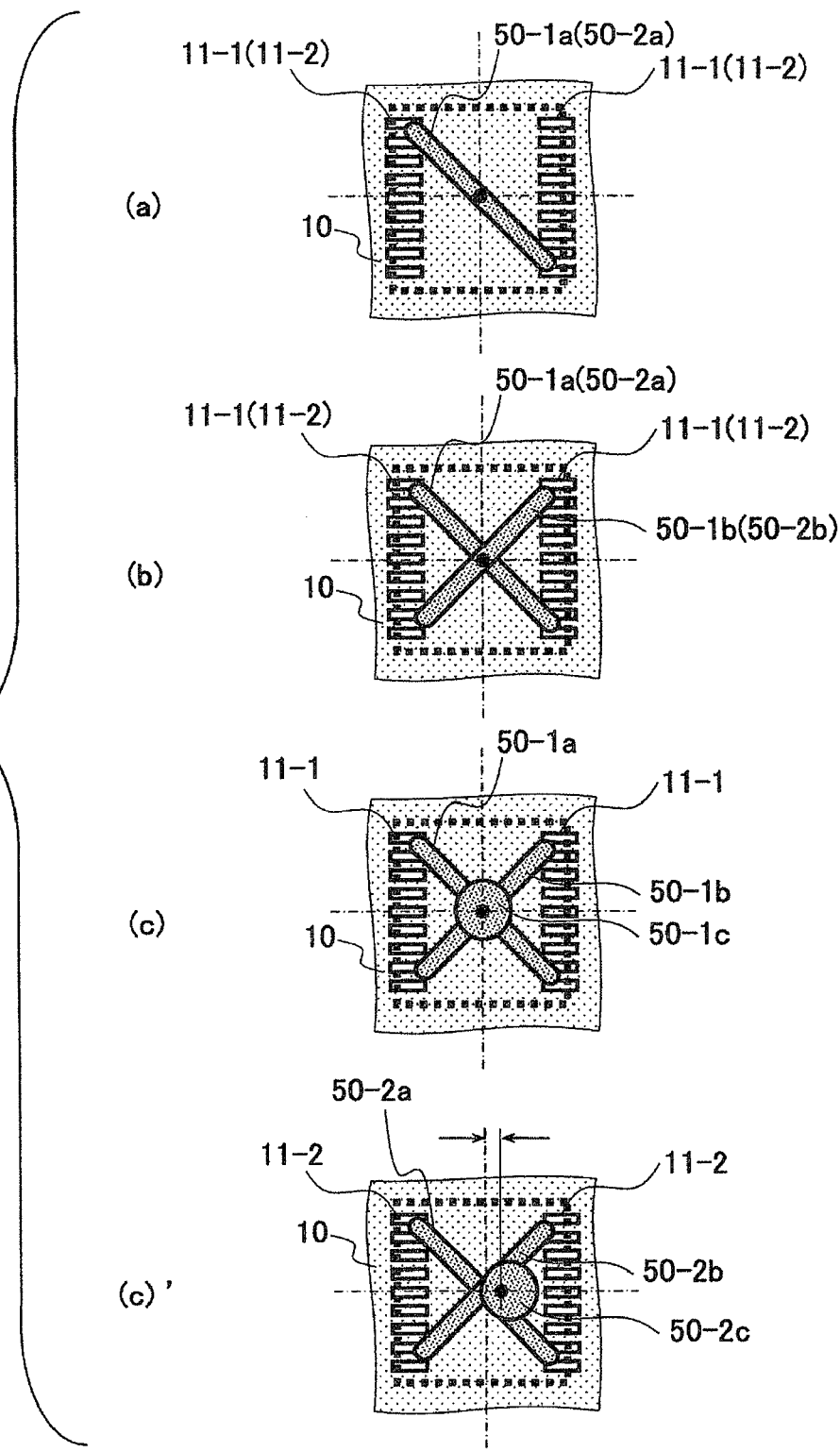
FIG. 12 is a plan view showing steps for providing adhesives 50-1 and 50-2 shown in FIG. 11.

Here, a providing method of the adhesive 50 in the third modified example of the providing pattern configuration is discussed with reference to FIG. 12.

First, the adhesive 50-1a is formed and provided on the wiring board 10 along a single diagonal of the mounting part S having the rectangular-shaped configuration by a dispensing method. See FIG. 12(*a*).

Next, the adhesive 50-1b is formed and provided on the wiring board 10 along another diagonal of the mounting part S having the rectangular-shaped configuration. See FIG. 12(*b*). As a result of this, the adhesives 50-1a and 50-2 are provided so as to cross each other on the substantially center part of the mounting part S.

Then, the adhesive 50-1c is provided in a circular-shaped manner on the crossing point of the adhesives 50-1a and 50-1b, namely on the center part of the mounting part S1. See FIG. 12(*c*).

On the other hand, on the mounting parts S2 through S5, the adhesive 50-2c is provided in the circular-shaped manner in a position shifted from the crossing point of the adhesives 50-2a and 50-2b to the side of the mounting part S1. See FIG. 12(*c'*).

As discussed above, this setting is made by considering influence of the compressed air jetted from the suction tool.

Such a providing or forming method is not limited to this third modified example but is applied to the first modified example and the second modified example.

While the adhesive provided on the mounting part S has liner shaped providing pattern configurations in the above-discussed examples, the present invention is not limited to these examples.

Figure 13:
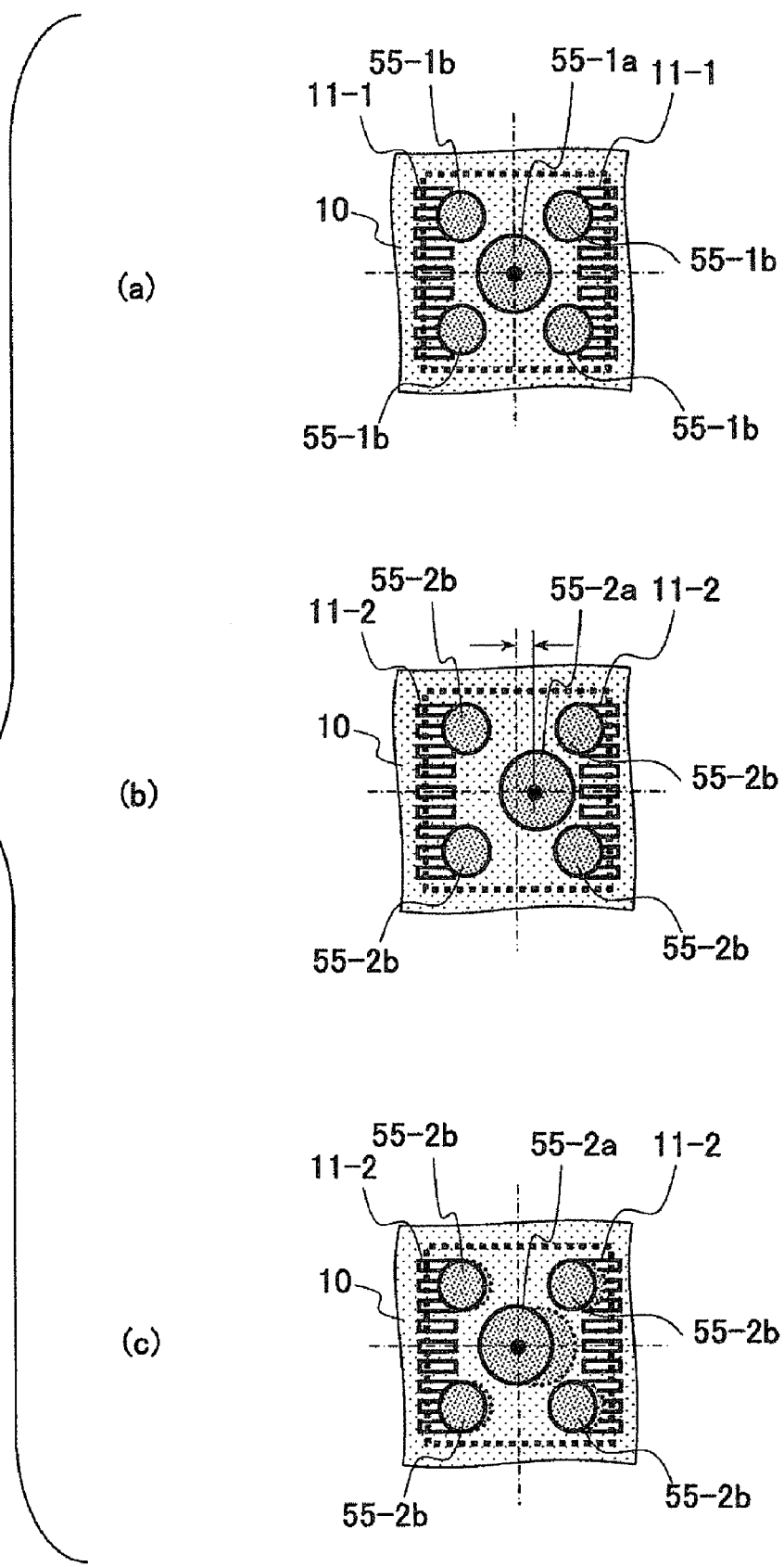
FIG. 13 is a plan view showing a fourth modified example of the forming patterns of the adhesives on the mounting parts S1 through S5.

A fourth modified example of a pattern configuration of the adhesive on the mounting part S is shown in FIG. 13.

In this modified fourth example, an adhesive 55-1a having a relatively large area is provided in a circular-shaped manner on the center part of the mounting part S1 having a rectangular-shaped configuration. The adhesives 55-1b having relatively small areas are provided in circular-shaped manners between the center part and four corners of the mounting part S1. See FIG. 13(*a*).

Under this structure, the provided amount of the adhesive 55-1 in the center part of the mounting part S1 is greatest so that the center of gravity of the volume of the adhesive 55-1 is positioned in the center of the mounting part S1 having the rectangular-shaped configuration (indicated by a black color circle in the adhesive 55-1 in FIG. 11(*a*)). Therefore, when the semiconductor element 20-1 is fixed on the mounting part S1, the adhesive 55-1 is easily and equally expanded in the entire area of the mounting part S1 so that the semiconductor element 20-1 can be securely fixed on the wiring board 10.

On the other hand, the adhesive 55 provided on the mounting parts S2 through S5 have pattern configurations different from the adhesive 55-1 formed on the mounting part S1. See FIG. 13(*b*).

Since provided patterns of the adhesives formed on the mounting parts S2 through S5 have the same configurations, only a pattern configuration of the adhesive 55-2 provided on the mounting part S2 is discussed and explanations of the adhesive 55 provided on the mounting parts S3 through S5 are omitted.

In other words, the adhesive 55-2a having the relatively large area is provided on the mounting part S2 in the circular-shaped manner so as to be shifted to a side of the mounting part S1 in FIG. 3.

In addition, the adhesives 55-2b having relatively small areas are provided between the center part and four corners of the mounting part S1 in circular-shaped manner so as to be slightly shifted to the side of the mounting part S1.

According to the above-discussed arrangement, the adhesive 55-2 is provided on the wiring board so that the center of gravity of the volume of the adhesive 55-2 is shifted from the center part of the mounting part S2 to the side of the mounting part S1 (portion indicated by a black circle in the adhesive 45-2 in FIG. 13(*b*)).

Thus, according to such an providing arrangement, when the semiconductor element 20-1 is mounted on the mounting part S1 neighboring and adjacent to the mounting part S2, due to the compressed air jetted from the suction tool, the center of gravity of the volume of the adhesive 55-2 moves to the center part of the mounting part S2. See FIG. 13(*c*).

Accordingly, when the semiconductor element 20-2 is fixed on the mounting part S2, the adhesive 55-2 is easily and equally expanded in the entire area of the mounting part S2 so that the semiconductor element 20-2 can be securely fixed on the wiring board 10.

Figure 14:
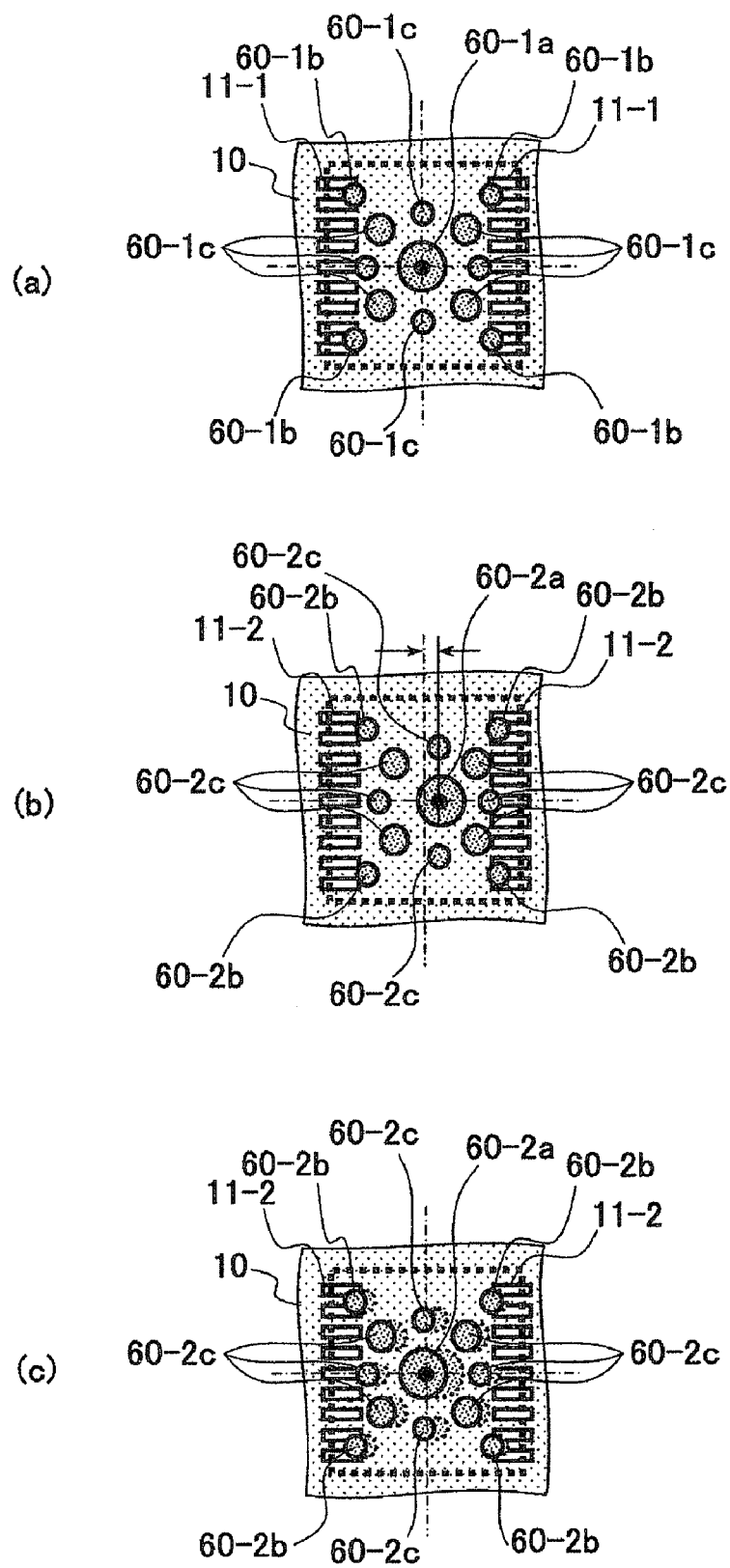
FIG. 14 is a plan view showing a fifth modified example of the forming patterns of the adhesives on the mounting parts S1 through S5.

A fifth modified example of a pattern configuration of the adhesive on the mounting part S is shown in FIG. 14.

In this modified fifth example, an adhesive 60-1a having a relatively large area is provided in a circular-shaped manner on the substantially center part of the mounting part S1 having a rectangular-shaped configuration. The adhesives 60-1b and 60-1c having relatively small areas are provided in circular-shaped manners between the center part and four corners of the mounting part S1 so as to surround the adhesive 60-1a. See FIG. 14(*a*).

Under this structure, the center of gravity of the volume of the adhesive 60-1 is positioned in the center of the mounting part S1 having the rectangular-shaped configuration (indicated by a black color circle in the adhesive 60-1 in FIG. 14(*a*)).

Therefore, when the semiconductor element 20-1 is fixed on the mounting part S1, the adhesive 60-1 is easily and equally expanded in the entire area of the mounting part S1 so that the semiconductor element 20-1 can be securely fixed on the wiring board 10.

On the other hand, the adhesive 60 provided on the mounting parts S2 through S5 have pattern configurations different from the adhesive 60-1 formed on the mounting part S1. See FIG. 14(b).

Since provided pattern of the adhesives formed on the mounting parts S2 through S5 have the same configurations, only a pattern configuration of the adhesive 60-2 provided on the mounting part S2 is discussed and explanations of the adhesive 60 provided on the mounting parts S3 through S5 are omitted.

In other words, the adhesive 60-2a having the relatively large area is provided on the mounting part S2 in the circular-shaped manner so as to be shifted to a side of the mounting part S1 in FIG. 3.

In addition, the adhesives 60-1b and 60-1c having relative small areas are provided between the center part and four corners of the mounting part S1 in circular-shaped manners so as to surround the adhesive 60-1a and be slightly shifted to the side of the mounting part S1.

That is to say, the adhesive 60-2 is provided on the wiring board so that the center of gravity of the volume of the adhesive 60-2 is shifted from the center part of the mounting part S2 to the side of the mounting part S1 (portion indicated by a black circle in the adhesive 60-2 in FIG. 14(b)).

Thus, according to such an providing arrangement, when the semiconductor element 20-1 is mounted on the mounting part S1 neighboring and adjacent to the mounting part S2, due to the compressed air jetted from the suction tool, the center of gravity of the volume of the adhesive 60-2 moves to the center part of the mounting part S2. See FIG. 14(c).

Accordingly, when the semiconductor element 20-2 is fixed on the mounting part S2, the adhesive 60-2 is easily and equally expanded in the entire area of the mounting part S2 so that the semiconductor element 20-2 can be securely fixed on the wiring board 10.

The present invention is not limited to the pattern configurations formed on the mounting parts S1 through S5 of plural modified examples.

In other words, there is no limitation of the present invention as long as when the semiconductor element is fixed on the single mounting part Sn, the adhesive is equally expanded in the entire area of the mounting part Sn so that the semiconductor element can be securely fixed on the wiring board without generation of deviation of the volume distribution of the adhesive.

Because of this, the adhesive is selectively provided on the mounting part Sn so that the center of gravity of the volume of the adhesive on the mounting part Sn is shifted in a direction toward the mounting part Sm neighboring and adjacent to the mounting part Sn, the mounting part Sm where the semiconductor element is mounted before the semiconductor element is mounted on the mounting part Sn.

Thus, according to the embodiment of the present invention, when the electronic components such as the semiconductor elements on the mounting parts S via the adhesives, the centers of gravities of the volumes or providing pattern configurations of the adhesives provided on the mounting parts S are set in advance based on the positions or orders of the electronic components to be mounted.

Because of this, when the electronic component is fixed on the wiring board, as corresponding to jets of the compressed air jetted from the suction tool for suction and holding the electronic component, the center of gravity of the volume of the adhesive is moved to the center part of the mounting part S.

In addition, when the electronic component is mounted on a certain mounting part S, while the center of gravity of the volume of the adhesive on a adjacent or neighboring mounting part S moves, the electronic component is mounted and fixed on each mounting part S.

After that, the wiring board 10 is cut for every mounting part S so that each semiconductor device is formed.

In the first embodiment of the present invention and the modified examples of this, plural electronic components such as the semiconductor elements are mounted on a single wiring board having a rectangular-shaped configuration in a line in a longitudinal direction of the wiring board.

Next, a method is discussed for providing adhesives and mounting and fixing electronic components such as semiconductor elements in a case where the electronic components are mounted and fixed in order on a wiring board where plural mounting parts S are provided.

Second Embodiment of the Present Invention

Figure 15:
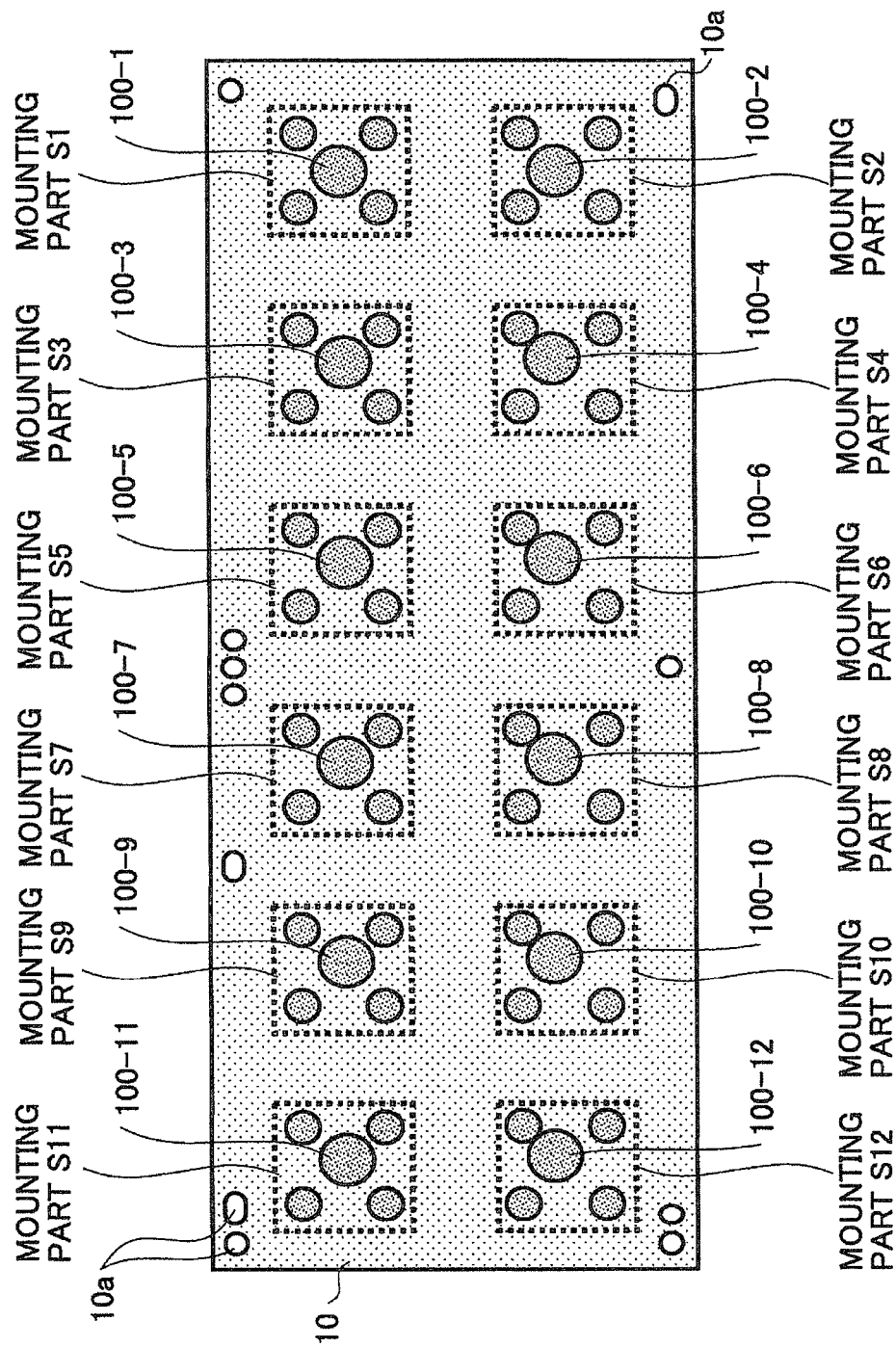
FIG. 15 is a plan view showing a method for mounting electronic components on a wiring board of a second embodiment of the present invention.

A method for mounting electronic components on a wiring board of a second embodiment of the present invention is discussed with reference to FIG. 15.

In the second embodiment of the present invention, plural lines, at least two lines, of semiconductor elements are mounted on a single wiring board in a longitudinal direction of the wiring board. In FIG. 15, parts that are the same as the parts shown in FIG. 4 are given the same reference numerals, and explanation thereof is omitted.

In this embodiment, on a main surface of the wiring board 10, two lines of plural mounting parts S of semiconductor elements are provided in a longitudinal direction of the wiring board 10. The mounting parts S have rectangular-shaped configurations as shown by dotted lines in FIG. 15.

The semiconductor elements S are mounted on a mounting part S1, a mounting part S2, a mounting part S3, . . . , a mounting part S11, and a mounting part S12, in this order.

Because of the arrangement of the mounting parts S and the order of mounting and fixing the semiconductor elements on the mounting parts S, when the semiconductor elements are mounted and fixed on the mounting parts S, it is necessary to consider the effect of the compressed air on each adhesive of each of plural mounting parts S situated in the periphery.

In other words, when the semiconductor element is mounted and fixed on a certain mounting part S, it is necessary to consider the effect of the compressed air to the mounting parts S positioned in not only the longitudinal direction of the wiring board where the mounting parts S are arranged but also a direction perpendicular to the longitudinal direction oblique direction (for example, 45 degrees direction) sandwiched between the longitudinal direction and the direction perpendicular to the longitudinal direction.

A structure of the providing patterns of the adhesive corresponding to the effect of the compressed air in plural directions is discussed with reference to FIG. 16.

Here, pattern configurations of adhesives 100-1 through 100-4 provided on the mounting parts S1 through S4 are discussed.

Figure 16:
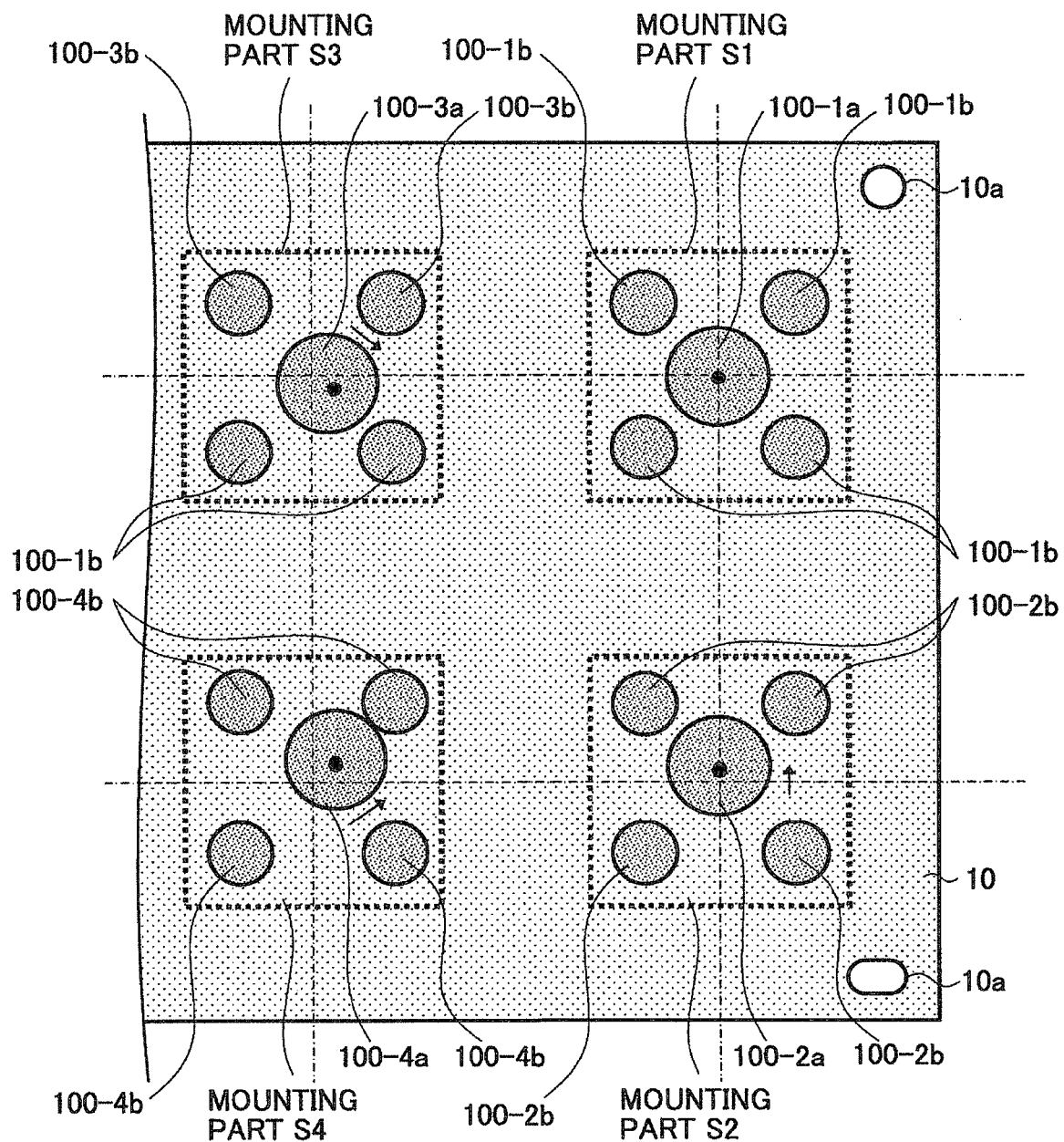
FIG. 16 is a plan view showing an area of the wiring board shown in FIG. 15 where mounting parts S1 through S4 are provided.

First, the semiconductor element 20 is mounted and fixed on the mounting part S1 (not shown in FIG. 16). Accordingly, the adhesive 100-1 is provided on the mounting part S1 so that the center of gravity of the volume of the adhesive 100-1 is positioned in the center of the mounting part S1.

In other words, an adhesive 100-1a having a relatively large area is provided in a circular-shaped manner on the center part of the mounting part S1 having a rectangular-shaped configuration. The adhesives 100-1b through 100-1d having relatively small areas are provided in circular-shaped manners between the center part and four corners of the mounting part S1.

According to this arrangement, the center of gravity of the volume of the adhesive 100-1 is positioned in the center of the mounting part S1 having the rectangular-shaped configuration (indicated by a black color circle in the adhesive 100-1 in FIG. 16).

Accordingly, when the semiconductor element 20-1 is fixed on the mounting part S1, the adhesive 100-1 is easily and equally expanded in the entire area of the mounting part S1 so that the semiconductor element 20-1 can be securely fixed on the wiring board 10.

On the other hand, on the mounting parts S2 through S4 adjacent to or neighboring the mounting part S1, a forming pattern of the adhesive provided and formed on the mounting part S is determined by considering positions (directions) of other mounting parts S adjacent to or neighboring each neighboring part S, distance, fixing order of the semiconductor elements, and others.

In other words, on the mounting part S2, the flow of the compressed air jetted from the suction tool when the semiconductor element 20 is mounted or fixed on the mounting part S1 is along the direction perpendicular to the longitudinal direction of the wiring board 10. Therefore, the circular-shaped adhesive 100-2a having a relatively large area is provided so as to be shifted from the center part of the mounting part S1 to the side of the mounting part S1 in FIG. 16.

Similarly, the circular-shaped adhesives 100-2b through 100-2d having relatively small areas are provided between the center part and four corners of the mounting part S so as to be slightly shifted to the side of the mounting part S1 in FIG. 16. Thus, the center of gravity of the volume of the adhesive 100-2 is shifted from the center part of the mounting part S2 to the side of the mounting part S1.

Thus, by arranging the adhesive 100-2 on the mounting part S2, when the semiconductor element 20 is mounted on the mounting part S1, due to the compressed air jetted from the suction tool, the center of gravity of the volume of the adhesive 100-2 moves to the center part of the mounting part S2.

Accordingly, when the semiconductor element 20 is fixed on the mounting part S1, the adhesive 100-2 is easily and equally expanded in the entire area of the mounting part S2 so that the semiconductor element 20 can be securely fixed on the wiring board 10.

In the mounting part S3, when the semiconductor element 20 is mounted or fixed on the mounting part S1, the compressed air jetted from the suction tool flows in a direction parallel with the longitudinal direction of the wiring board 10. Furthermore, when the semiconductor element 20 is mounted and fixed on the mounting part S2, the compressed air jetted from the suction tool is flowed in a approximately 45 degrees direction sandwiched between the longitudinal direction of the wiring board and a direction perpendicular to the longitudinal direction. The timings of flowing the compressed air flowing in two directions are different from each other.

Accordingly, the circular shaped adhesive 100-3a having a relatively large area is provided on the mounting part S3, so as to be shifted from the center part of the mounting part S3 to the sides of the mounting parts S1 and S2, namely to a part shifted in a direction of the sum of a vector of a direction to the mounting part S1 and a vector of a direction to the mounting part S2.

Similarly, the circular-shaped adhesives 100-3b through 100-3d having relatively small areas are provided between the center part and four corners of the mounting part S3 so as to be slightly shifted to the sides of the mounting parts S1 and S2, namely to a part shifted in a direction of the sum of a vector of a direction to the mounting part S1 and a vector of a direction to the mounting part S2.

According to this arrangement, the adhesive 100-3 is provided so that the center of gravity of the volume of the adhesive 100-3 is shifted to the sides of the mounting parts S1 and S2, namely to a part shifted in a direction of the sum of a vector of a direction to the mounting part S1 and a vector of a direction to the mounting part S2.

Thus, by arranging the adhesive 100-3 on the mounting part S3, when the semiconductor elements 20 are mounted on the mounting parts S1 and S2, due to the compressed air jetted from the suction tool, the center of gravity of the volume of the adhesive 100-3 moves to the center part of the mounting part S3.

Accordingly, when the semiconductor element 20 is fixed on the mounting part S3, the adhesive 100-3 is easily and equally expanded in the entire area of the mounting part S3 so that the semiconductor element 20 can be securely fixed on the wiring board 10.

In the mounting part S4, when the semiconductor element 20 is mounted or fixed on the mounting part S1, the compressed air jetted from the suction tool 26 or 28 flows in a 45 degrees direction sandwiched between the longitudinal direction of the wiring board and the direction perpendicular to the longitudinal direction. Furthermore, when the semiconductor element 20 is mounted and fixed on the mounting part S2, the compressed air jetted from the suction tool is flowed in a direction parallel with the longitudinal direction. In addition, when the semiconductor element 20 is mounted and fixed on the mounting part S3, the compressed air jetted from the suction tool is flowed in a direction perpendicular to the longitudinal direction of the wiring board. The timings of flowing the compressed air in three directions are different from each other.

Accordingly, the circular shaped adhesive 100-4a having a relatively large area is provided on the mounting part S4, so as to be shifted from the center part of the mounting part S4 to the sides of the mounting parts S1, S2 and S3, namely to a part shifted in a direction of the sum of a vector of a direction to the mounting part S1, a vector of a direction to the mounting part S2, and a vector of a direction to the mounting part S3.

Similarly, the circular-shaped adhesives 100-4b through 100-4d having relatively small areas are provided between the center part and four corners of the mounting part S4 so as to be slightly shifted to the sides of the mounting parts S1, S2 and S3, namely to a part shifted in a direction of the sum of a vector of a direction to the mounting part S1, a vector of a direction to the mounting part S2, and a vector of a direction to the mounting part S3.

According to this arrangement, the adhesive 100-4 is provided so that the center of gravity of the volume of the adhesive 100-4 is shifted to the sides of the mounting parts S1, S2, and S3, namely to a part shifted in a direction of the sum of a vector of a direction to the mounting part S1, a vector of a direction to the mounting part S2, and a vector of a direction to the mounting part S3.

Thus, by arranging the adhesive 100-4 on the mounting part S4, when the semiconductor elements 20 are mounted on the mounting parts S1, S2 and S3, due to the compressed air jetted from the suction tool, the center of gravity of the volume of the adhesive 100-4 moves to the center part of the mounting part S4.

Accordingly, when the semiconductor element 20 is fixed on the mounting part S4, the adhesive 100-4 is easily and equally expanded in the entire area of the mounting part S4 so that the semiconductor element 20 can be securely fixed on the wiring board 10.

Similarly, the effect of the compressed air from the mounting part S1 through the mounting part S(n−1) where the semiconductor elements 20 are mounted just before the semiconductor element is mounted on the mounting parts S5 through S12 is considered for the adhesion of the adhesives 100-5 through 100-12.

In other words, the adhesive 100 is provided at each mounting part S so that the center of gravity of the volume of the adhesive 100 is shifted. Due to the compressed air jetted from the suction tool, just before the semiconductor element is mounted on a designated mounting area Sn, the center of gravity of the volume of the adhesive 100 on the designated mounting area Sn is moved to the center part of the mounting part Sn.

Accordingly, when the semiconductor element 20 is fixed on the mounting part Sn, the adhesive 100-2 is easily and equally expanded in the entire area of the mounting part Sn so that the semiconductor element 20 can be securely fixed on the wiring board 10 without generation of deviation of the volume distribution of the adhesive 100-2.

Thus, the semiconductor elements 20 are mounted and fixed on the mounting parts S1 through S12 via the adhesives 100 provided with designated patterns.

Figure 17:
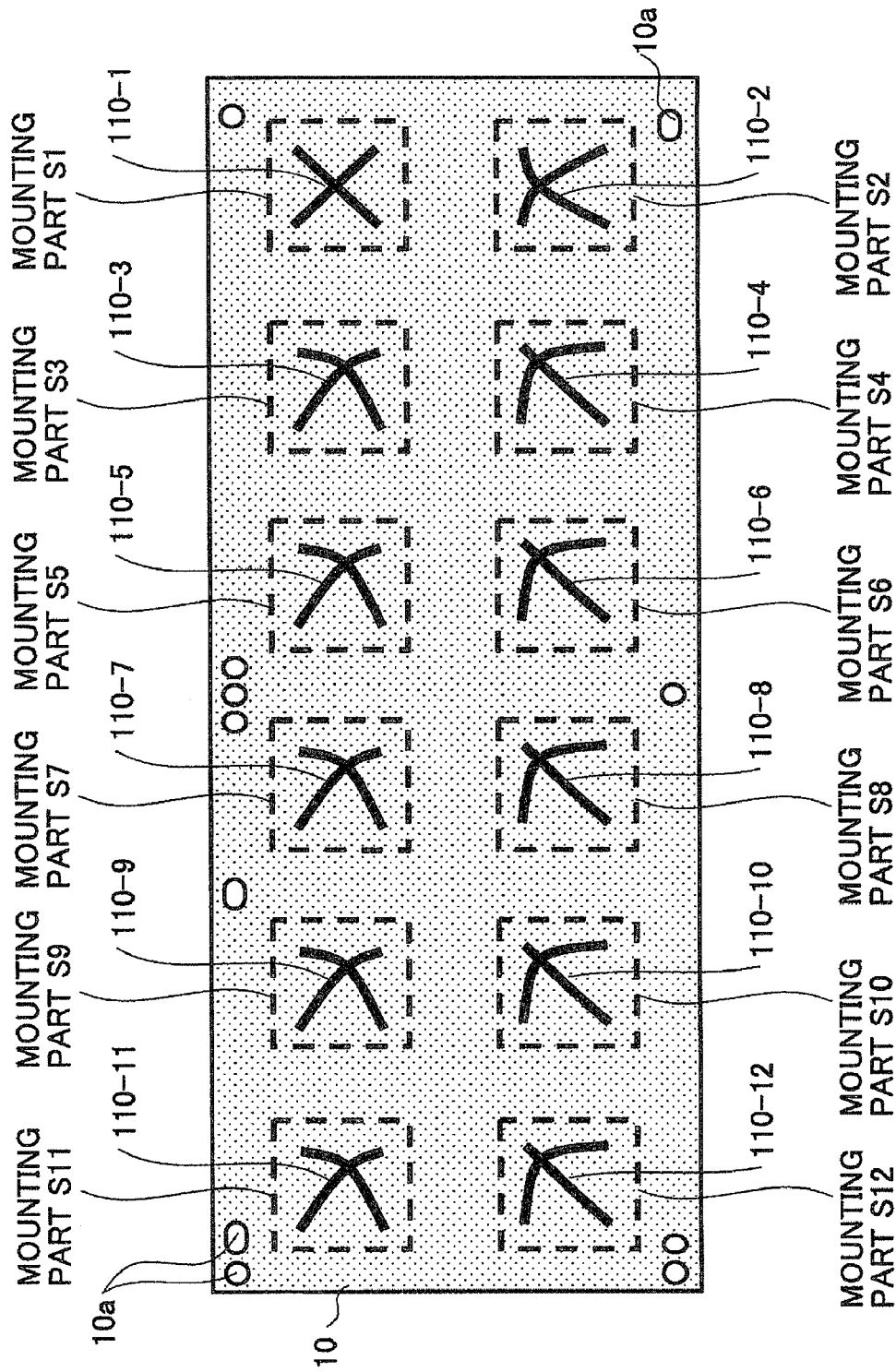
FIG. 17 is a plan view showing a method for mounting electronic components on a wiring board of a modified example of the second embodiment of the present invention.

The forming patterns of the adhesives provided on the mounting parts S may be the same as those shown in FIG. 17. Here, FIG. 17 shows a modified example where the adhesives are provided on the wiring board of the second embodiment of the present invention.

In this modified example, for example, the adhesives 110-1a and 110-1b are provided along diagonals of the mounting part S in linear so as to cross each other. According to this providing arrangement, the amount of providing of the adhesive 110-1 on a crossing point is greatest so that the center of gravity of the volume of the adhesive 40-1 is positioned on the crossing point on the mounting part S1.

The effect of the compressed air from the mounting part S1 through the mounting part S(n−1) where the semiconductor element 20 is mounted just before the semiconductor element is mounted on the mounting part S5 through S12 is considered for positioning the crossing part of the adhesives 110-na and 110-nb, namely the center of gravity of the volume, to a part shifted in a direction of the sum of vectors to plural adjacent or neighboring mounting parts S. Due to shifting of the crossing part, the adhesives 110-na and 110-nb are curved if necessary and the length or width of the adhesives 110-na and 110-nb are selected.

Thus, due to the compressed air jetted from the suction tool, just before the semiconductor element is mounted on a designated mounting area Sn, the center of gravity of the volume of the adhesive 100 on the designated mounting area Sn is moved to the center part of the mounting part Sn.

Accordingly, when the semiconductor element 20 is fixed on the mounting part Sn, the adhesive 110 is easily and equally expanded in the entire area of the mounting part Sn so that the semiconductor element 20 can be securely fixed on the wiring board 10 without generation of deviation of the volume distribution of the adhesive 110.

Third Embodiment of the Present Invention

Next, a method for mounting electronic components on a wiring board of a third embodiment of the present invention is discussed with reference to FIG. 18 and FIG. 19.

In the third embodiment of the present invention, plural lines, at least two lines of package board parts are provided in a longitudinal direction of a single wiring board. Plural semiconductor elements are mounted on the package board parts.

Figure 18:
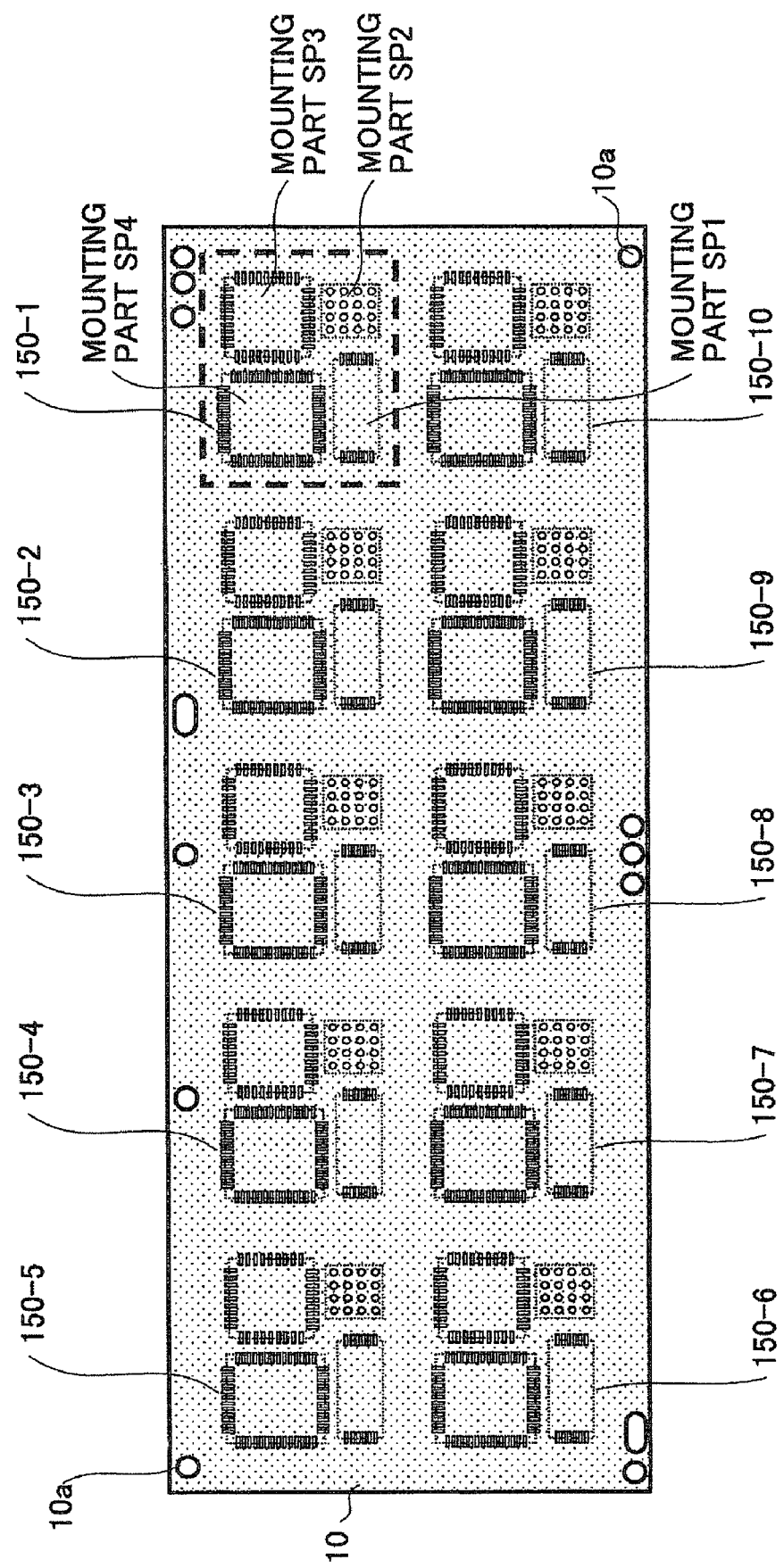
FIG. 18 is a plan view showing a method for mounting electronic components on a wiring board of a third embodiment of the present invention.

In an example shown in FIG. 18, on the wiring board 10, two lines of five package board parts 150 each having four mounting parts SP where the semiconductor elements are mounted are provided in a longitudinal direction of the wiring board 10.

Figure 19:
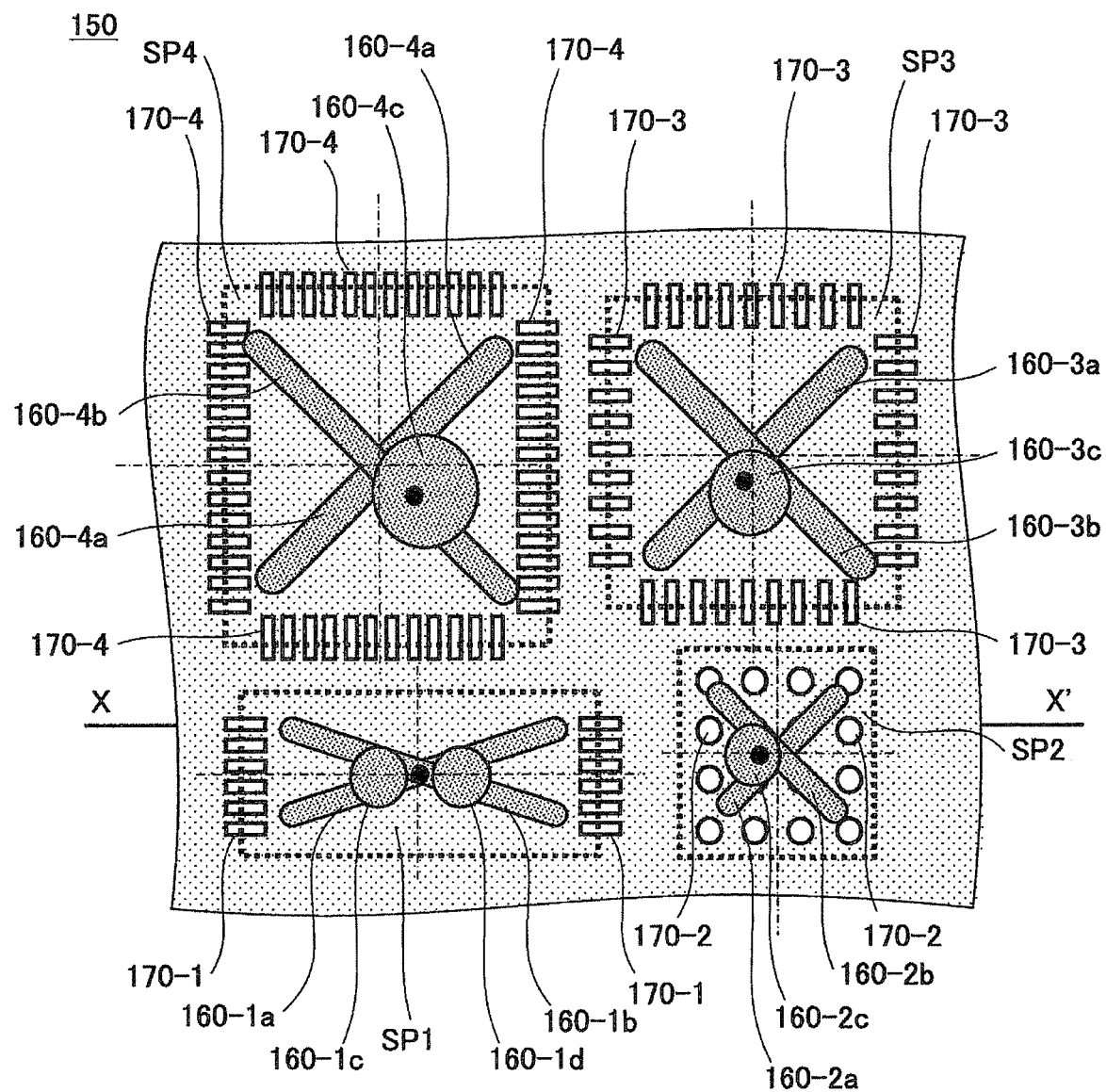
FIG. 19 is a plan view showing a package area surrounded by a dotted line in FIG. 18.
Figure 20:
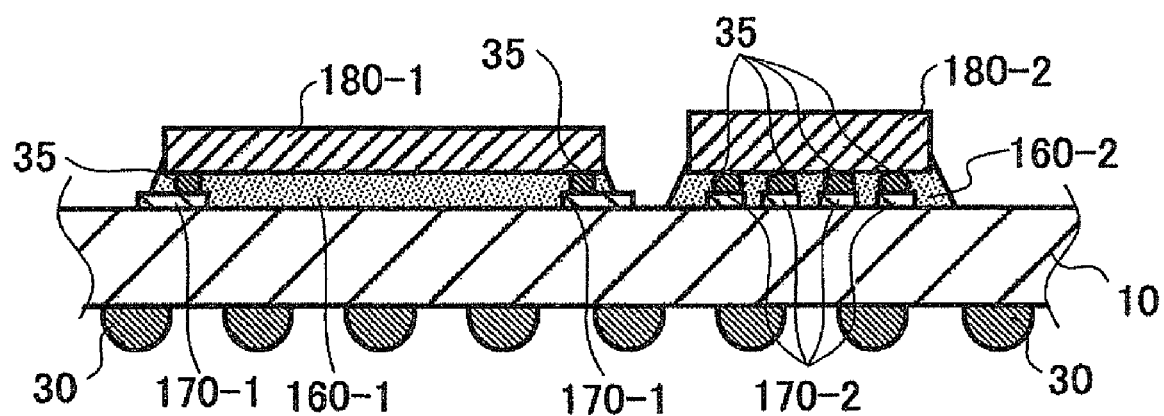
FIG. 20 is a cross-sectional view of a wiring board taken along a line X-X' in FIG. 19.

FIG. 19 is an expanded view of a part of the package board part 150 surrounded by a dotted line in FIG. 18. In addition, FIG. 20 shows a state where a semiconductor element 180 is mounted and fixed on one of the package board parts 150.

On a single package board part 150, four semiconductor elements are mounted and fixed on a mounting part S1, a mounting part S2, a mounting part S3, and a mounting part S4, in this order. The mounting order of the semiconductor elements are determined by height (thickness) of the semiconductor element to be mounted or distance between the mounting parts SP.

As shown in FIG. 19, adhesives 160-1a and 160-1b are provided along diagonals of the mounting part SP1 having a rectangular shaped configuration so as to cross each other. In addition, circular-shaped adhesives 160-1c and 160-1d are provided in the vicinity of the crossing point of the adhesives 160-1a and 160-1b situated in the center part of the mounting part S1.

According to this providing arrangement, the amount of providing of the adhesive 160-1 in the vicinity of on the center part of the mounting part SP1 is greatest so that the center of gravity of the volume of the adhesive 160-1 is positioned on the crossing point (a part indicated by a black circle in the adhesive 160-1 shown in FIG. 19).

In other words, the provided amount of the adhesive 160-1 in the center part of the first mounting part S1 is greatest so that the center of gravity of the volume of the adhesive 160-1 is positioned in the center of the mounting part S1 having the rectangular configuration. Therefore, when the semiconductor element 180-1 is fixed on the mounting part S1, the adhesive 160-1 is easily and equally expanded in the entire area of the mounting part S1.

Since the providing pattern of the adhesive 160-1 is formed by linear adhesives 160-1a and 160-1b and circular-shaped adhesives 160-1c and 160-1d, it is possible to easily control dispensing when the adhesive 160-1 is provided. Because of this, it is possible to securely fix the semiconductor element 180-1 on the wiring board without generation of deviation of the volume distribution of the adhesive 160-1.

On the other hand, the adhesives 160-2 through 160-4 provided on the mounting parts SP2 through SP4 have pattern configurations different from the adhesive 160-1 formed on the mounting part SP1.

Adhesives 160-2a and 160-2b are provided along diagonals of the second mounting part SP2 having a rectangular-shaped configuration where plural outside connection terminals 170-2 are provided so as to cross each other. In addition, circular-shaped adhesive 160-2c is provided so as to be shifted from the center part of the mounting part SP2 to the side of the mounting part S1.

As a result of this, the center of gravity of the volume of the adhesive 160-2 is a part indicated by a black circle in the adhesive 160-2 in FIG. 19.

Thus, by arranging the adhesive 160-2 on the mounting part SP2, when the semiconductor element 180-1 is mounted on the mounting part SP1, due to the compressed air W jetted from the suction tool, the center of gravity of the volume of the adhesive 160-2 moves to the center part of the mounting part S2.

Accordingly, when the semiconductor element 180-2 is fixed on the mounting part SP2, the adhesive 160-2 is easily and equally expanded in the entire area of the mounting part SP2 so that the semiconductor element 180-2 can be securely fixed on the wiring board 10.

In the mounting part SP3 where plural outside connection terminals 170-3 are provided along four sides of the rectangular-shaped area, the adhesives 160-3a and 160-3b are provided along the diagonals of the rectangular-shaped area so as to cross each other. The circular shaped adhesive 160-3c is provided on the mounting part SP3, so as to be shifted from the center part of the mounting part SP3 in a direction of the sum of a vector of a direction to the mounting part SP1 and a vector of a direction to the mounting part SP2.

As a result of this, the center of gravity of the volume of the adhesive 160-3 is a part indicated by a black circle in the adhesive 160-3 in FIG. 19.

According to this providing arrangement of the adhesive 160-3, when the semiconductor elements are mounted on the mounting parts SP1 and SP2, due to the compressed air W jetted from the suction tool, the center of gravity of the volume of the adhesive 160-3 moves to the center part of the mounting part SP3.

Accordingly, when the semiconductor element 180-3 is fixed on the mounting part SP3, the adhesive 160-3 is easily and equally expanded in the entire area of the mounting part SP3 so that the semiconductor element 180-3 can be securely fixed on the wiring board 10 without generation of deviation of the volume distribution of the adhesive 160-3.

In the mounting part SP4 where plural outside connection terminals 170-4 are provided along four sides of the rectangular-shaped area, the adhesives 160-4a and 160-4b are provided along the diagonals of the rectangular-shaped area so as to cross each other. The circular shaped adhesive 160-3c is provided on the mounting part SP3, so as to be shifted from the center part of the mounting part SP3 in a direction of the sum of a vector of a direction to the mounting part SP2 and a vector of a direction to the mounting part SP3.

As a result of this, the center of gravity of the volume of the adhesive 160-4 is a part indicated by a black circle in the adhesive 160-4 in FIG. 19.

According to this providing arrangement of the adhesive 160-4, when the semiconductor elements are mounted on the mounting parts SP1 and SP3, due to the compressed air W jetted from the suction tool, the center of gravity of the volume of the adhesive 160-4 moves to the center part of the mounting part SP4.

Accordingly, when the semiconductor element 180-4 is fixed on the mounting part SP4, the adhesive 160-4 is easily and equally expanded in the entire area of the mounting part SP4 so that the semiconductor element 180-4 can be securely fixed on the wiring board 10 without generation of deviation of the volume distribution of the adhesive 160-4.

Thus, after the four semiconductor elements are mounted and fixed on the first package board part 150-1 of the wiring board 10, four semiconductor elements are mounted and fixed on the second package board part 150-2.

After that, the semiconductor elements are mounted and fixed on other package board parts 150 of the wiring board 10 by the same mounting method.

After that, plural outside connection terminals 30 such as solder electrodes made of tin (Sn)—silver (Ag) solder or tin (Sn)—silver (Ag)—copper (Cu) are provided on another main surface (rear surface) of the wiring board 10 where plural semiconductor elements 20 are mounted and fixed.

In FIG. 20, a state where the semiconductor element 180 is mounted on the package board part 150 of the wiring board 10 and the outside connection terminals are provided on another main surface of the wiring board 10 is shown. FIG. 20 is a cross-sectional view taken along a line X-X' in FIG. 19.

After that, the wiring board 10 is cut by a dicing blade or the like so that pieces of the package board parts 150 are formed (piece forming process). Hence, a package structure where four semiconductor elements 180-1 through 180-4 are mounted on the mounting parts S1 through S4 is formed.

The forming patterns of the adhesives 160 provided on the mounting parts SP1 through SP4 of the package board parts 150 are an example. The present invention is not limited to this example.

In other words, the providing pattern of the adhesive 160 may have configurations shown in FIG. 9, FIG. 10, FIG. 13, FIG. 14, or FIG. 17.

In other words, there is no limitation of the present invention as long as when the semiconductor element is fixed on the single mounting part SP, the adhesive is equally expanded in the entire area of the mounting part SP so that the semiconductor element can be securely fixed on the wiring board without generation of deviation of the volume distribution of the adhesive.

That is, the adhesive is provided so that the center of gravity of the volume of the adhesive provided on the mounting part SO is positioned in a part shifted in a direction of (sum of) a vector(s) to the mounting part SPn where the semiconductor element is mounted before the mounting part SP.

As a result of this, when the semiconductor element is mounted on the mounting part SPn before the semiconductor element is mounted on the mounting part So, due to the compressed air jetted from the suction tool, the center of gravity of the volume of the adhesive is moved to the center part of the mounting part SP.

On the wiring board 10 shown in FIG. 18, the pattern configuration of the adhesive provided on the four mounting parts SP of the package board part 150-1 through 150-10 is selected.

On the other hand, there is a sufficient gap between neighboring package board parts, for example, between the package board parts 150-1 and 150-2, 150-1 and 150-9 or 150-1 and 150-10. Therefore, even when the semiconductor elements are mounted on the neighboring package board parts, there is no effect of the compressed air jetted from the suction tool, namely deformation or movement of the adhesive.

Even if there is an effect of the compressed air due to the suction tool between the package board parts, it is possible to properly arrange the adhesives by following the embodiments of the present invention.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-35280 filed on Feb. 15, 2007, the entire contents of which are hereby incorporated by reference.

What is claimed is:

1. A method for mounting electronic components, comprising:
   providing an adhesive on each of plural electronic component mounting parts on a wiring board sequentially at a time; and
   fixing each of the electronic components to a corresponding one of the plural electronic component mounting parts sequentially via the adhesive;
   wherein, when the adhesive is provided on each of the plural electronic component mounting parts, the center of gravity of a volume of the adhesive provided on the mounting part where an Nth electronic component is to be mounted is shifted within said mounting part from the center of said mounting part in a direction closer to the preceding mounting part where an (N minus 1 or greater)th electronic component is mounted adjacent to the mounting part where the Nth electronic component is to be mounted.

2. The method for mounting electronic components as claimed in claim 1, wherein the center of gravity of the volume of the adhesive provided on the mounting part where the Nth electronic component is to be mounted is provided so as to be shifted in a direction toward a center of an area of an adjacent one of the mounting parts where the (N minus 1 or greater)th electronic component is mounted.

3. The method for mounting electronic components as claimed in claim 1, wherein, if N equals to 1, the adhesive is formed on the mounting part in a substantially symmetrical manner so that the center of gravity of a volume of the adhesive is formed on the mounting part where the electronic component is to be mounted.

4. The method for mounting electronic components as claimed in claim 1, wherein the adhesive is provided by a dispensing method; and the adhesive dispensed in a pattern on the electronic component mounting part of the wiring board.

5. The method for mounting electronic components as claimed in claim 4, wherein the adhesive which is dispensed in a pattern has a substantially linear or circular-shaped pattern configuration.

6. The method for mounting electronic components as claimed in claim 4, wherein the adhesive provided on at least a center of or adjacent to the center of the mounting part among the adhesive dispensed in a pattern on the mounting part where the Nth electronic component is to be mounted is dispensed as corresponding to compressed air jetted from a suction tool when an (N minus 1 or greater)th electronic component is being mounted.

7. The method for mounting electronic components as claimed in claim 1, wherein, during fixing, the wiring board and the adhesive formed on each electronic component mounting part of the wiring board are heated.

8. The method for mounting electronic components as claimed in claim 1, wherein the electronic component mounting part of the wiring board has a substantially rectangular-shaped configuration.

9. The method for mounting electronic components as claimed in claim 1, wherein the electronic component is a semiconductor element having a main surface where outside connection terminals are provided.

10. The method for mounting electronic components as claimed in claim 1, further comprising:
    cutting the wiring board for every electronic component mounting part after the electronic components are mounted on the electronic component mounting parts.

11. The method for mounting electronic components as claimed in claim 1, wherein a plurality of package board parts are formed on the wiring board; after the electronic components are mounted on the package board parts, the wiring board is cut for every package board part.

12. A method for mounting electronic components, comprising:
    providing an adhesive on each of plural electronic component mounting parts on a wiring board sequentially at a time; and
    fixing each of the electronic components to a corresponding one of the plural electronic component mounting parts sequentially via the adhesive;
    wherein, when the adhesive is provided on each of the plural electronic component mounting parts, the center of gravity of a volume of the adhesive provided on the mounting part where an Nth electronic component is to be mounted is shifted within said mounting part from the center of said mounting part in a direction of a sum of vectors to centers of the areas of the preceding mounting parts where (N minus 1 or greater)th electronic components are mounted adjacent to the mounting part where the Nth electronic component is to be mounted.

* * * * *